United States Patent
He et al.

(10) Patent No.: US 9,406,649 B2
(45) Date of Patent: *Aug. 2, 2016

(54) STACKED MULTI-CHIP INTEGRATED CIRCUIT PACKAGE

(71) Applicant: QUALCOMM Incorporated, San Diego, CA (US)

(72) Inventors: Dongming He, San Diego, CA (US); Zhongping Bao, San Diego, CA (US); Zhenyu Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/598,053

(22) Filed: Jan. 15, 2015

(65) Prior Publication Data

US 2015/0155265 A1 Jun. 4, 2015

Related U.S. Application Data

(63) Continuation of application No. 13/647,375, filed on Oct. 8, 2012, now Pat. No. 8,963,339.

(51) Int. Cl.
*H01L 25/00* (2006.01)
*H01L 25/065* (2006.01)
*H01L 23/31* (2006.01)

(52) U.S. Cl.
CPC ............ *H01L 25/0652* (2013.01); *H01L 25/50* (2013.01); *H01L 23/3121* (2013.01);
(Continued)

(58) Field of Classification Search
CPC ............... H01L 25/0652; H01L 25/50; H01L 2924/14361; H01L 23/3121; H01L 2924/181; H01L 2225/06541; H01L 2924/35121; H01L 2924/3512; H01L 2924/3511; H01L 2924/15192; H01L 2924/1436; H01L 2924/1434
See application file for complete search history.

(56) References Cited

U.S. PATENT DOCUMENTS 6,369,448 B1 4/2002 McCormick
6,558,978 B1 5/2003 McCormick
(Continued)

FOREIGN PATENT DOCUMENTS

| CN | 1531085 A | 9/2004 |
|---|---|---|
| CN | 1612340 A | 5/2005 |
| CN | 102254835 A | 11/2011 |
| JP | 562101063 A | 5/1987 |
| JP | 2000294578 A | 10/2000 |
| JP | 2005101132 A | 4/2005 |

(Continued)

OTHER PUBLICATIONS

International Search Report and Written Opinion—PCT/US2013/063811—ISA/EPO—Feb. 12, 2014.

*Primary Examiner* — Roy Potter
(74) *Attorney, Agent, or Firm* — Michelle S. Gallardo

(57) ABSTRACT

A multi-chip integrated circuit (IC) package is provided which is configured to protect against failure due to warpage. The IC package may comprise a substrate, a level-one IC die and a plurality of level-two IC dies. The level-one IC die having a surface that is electrically coupled to the substrate. The plurality of level-two IC dies is stacked above the level-one IC die. The plurality of level-two IC dies may each have an active surface that is electrically coupled to the substrate. The plurality of level-two IC dies may be arranged side by side such that the active surfaces of the plurality of level-two IC dies are positioned substantially in a same plane. Relative to a single die configuration, the level-two IC dies are separated thereby inhibiting cracking, peeling and/or other potential failures due to warpage of the IC package.

30 Claims, 25 Drawing Sheets

(52) U.S. Cl.
CPC ....... *H01L25/0655* (2013.01); *H01L 2224/131* (2013.01); *H01L 2224/16225* (2013.01); *H01L 2224/16245* (2013.01); *H01L 2224/2919* (2013.01); *H01L 2224/32145* (2013.01); *H01L 2224/32225* (2013.01); *H01L 2224/32245* (2013.01); *H01L 2224/48227* (2013.01); *H01L 2224/48247* (2013.01); *H01L 2224/73203* (2013.01); *H01L 2224/73204* (2013.01); *H01L 2224/73253* (2013.01); *H01L 2225/06517* (2013.01); *H01L 2225/06541* (2013.01); *H01L 2924/10252* (2013.01); *H01L 2924/10253* (2013.01); *H01L 2924/14* (2013.01); *H01L 2924/1431* (2013.01); *H01L 2924/1433* (2013.01); *H01L 2924/1434* (2013.01); *H01L 2924/1436* (2013.01); *H01L 2924/14335* (2013.01); *H01L 2924/14361* (2013.01); *H01L 2924/15192* (2013.01); *H01L 2924/181* (2013.01); *H01L 2924/3511* (2013.01); *H01L 2924/3512* (2013.01); *H01L 2924/35121* (2013.01)

(56) References Cited

U.S. PATENT DOCUMENTS

| | | | |
|---|---|---|---|
| 7,339,278 | B2 | 3/2008 | Iksan et al. |
| 7,927,917 | B2 | 4/2011 | Pagaila et al. |
| 8,169,058 | B2 | 5/2012 | Pagaila et al. |
| 8,963,339 | B2 * | 2/2015 | He ................. H01L 25/50 257/738 |
| 2004/0178502 | A1 | 9/2004 | Ishikawa et al. |
| 2004/0262774 | A1 | 12/2004 | Kang et al. |
| 2005/0046040 | A1 | 3/2005 | Wang et al. |
| 2007/0228579 | A1 | 10/2007 | Kang |
| 2008/0258288 | A1 | 10/2008 | Park et al. |
| 2012/0068319 | A1 | 3/2012 | Choi et al. |
| 2014/0097535 | A1 | 4/2014 | He et al. |

FOREIGN PATENT DOCUMENTS

| | | |
|---|---|---|
| JP | 2005116932 A | 4/2005 |
| WO | WO-2010050087 A1 | 5/2010 |
| WO | WO-2010151350 A1 | 12/2010 |

* cited by examiner

STACKED MULTI-CHIP INTEGRATED CIRCUIT PACKAGE

BACKGROUND

1. Field

Various features relate to integrated circuits (ICs), and more particularly to multi-chip ICs and methods for making the same.

2. Background

The ever increasing demand for smaller, lighter, and faster portable electronic devices, such as mobile phones and laptop computers, has forced the electronics industry to create circuit components that feature greater capacity and performance, but smaller dimensions. For example, portable devices may now contain IC packages having two or more semiconductor dies stacked vertically and encased within the same molding compound of the IC package. Such multi-chip IC packages may be commonly referred to as "system-in-packages" (SIP) and "chip stack multi-chip modules" (MCM).

FIG. 1 illustrates a schematic, cross-sectional side view of an SIP 100 found in the prior art. The SIP 100 includes two IC dies 102, 104 that are stacked on top of each other. The top IC die 102 may be, for example, a memory circuit, and the bottom IC die 104 may be, for example, a processing circuit. The length and/or width of the top die 102 is larger than the length and/or width of the bottom die 104, and generally, the top die 102 may have a surface area that is greater than the bottom 104. The two dies 102, 104 are stacked on top of each other and encased within a single molding compound 106. The active surface 110 of the top die 102 is electrically coupled to a laminate substrate 108 via a plurality of soldering bumps 112a and conductive pillars 112b. The active surface 114 of the bottom die 104 is electrically coupled to the substrate 108 via another plurality of soldering bumps 116. In this fashion, both dies 102, 104 are electrically coupled to the substrate 108 in a flip-chip fashion, and communicate with each other through electrical connections (not shown) within the laminate substrate 108. The package 100 may be mounted onto a motherboard (e.g., PCB board) through a ball grid array or pin grid array structure (not shown).

FIG. 2 illustrates a schematic, top view of the SIP package 100 with the molding compound 106 removed thereby exposing the top IC die 102 underneath. The top die 102 has a length $l_A$ and a width $w_A$. FIG. 3 illustrates a schematic, bottom view of the SIP package 100. The substrate 108 and molding compound 106 have been omitted for clarity thereby exposing the top die 102 having the soldering bumps 112a and the bottom die 104 having the soldering bumps 116.

The top IC die 102 will have limited speed, performance, reliability, and/or throughput due to its relatively larger size (e.g., larger surface area and/or greater dimensions along its length and/or width) compared to the bottom IC die 104. For example, the top die 102 may suffer from crosstalk and electromagnetic interference (EMI) effects among the various IC components located on its active surface 110. These undesirable effects limit the clock speed at which the top die 102, for example volatile dynamic random access memory (DRAM), can reliability operate due to clock signal jitter.

Moreover, the larger, top die 102 is more prone to failure from open solder joints due to warpage effects. FIG. 4 illustrates a schematic, cross sectional side view of the SIP 100 (bottom die 104 and associated soldering bumps 116 have been omitted for clarity) where the substrate 108 has undergone significant concave warpage. According to the illustrated example, although some of the soldering bumps 402 near the corners 403 of the top die 102 remain in electrical contact with the substrate 108, other soldering bumps 404 near the center edge 405 of the top die 102 have separated away from the substrate 108 and are no longer in electrical contact with the substrate 108. Thus, warpage of the substrate 108 may lead to IC package 100 failure because critical connections between the top die 102 and the substrate 108 may become open/disconnected.

Therefore, there is a need for advanced multi-chip IC package designs that improve circuit speed and performance, and also protect against IC package failure due to warpage.

SUMMARY

A multi-chip integrated circuit (IC) package configured to resist failure due to warpage. The IC package may include a substrate, a level-one IC die, and a plurality of level-two IC dies. The level-one IC die may have a surface that is electrically coupled to the substrate. The plurality of level-two IC dies may be stacked above the level-one IC die, with the plurality of level-two IC dies each having an active surface that is electrically coupled to the substrate. The plurality of level-two IC dies may be arranged side by side such that the active surfaces of the plurality of level-two IC dies are positioned substantially in a same plane. A plurality of electrical conductors may electrically couple the plurality of level-two IC dies to the substrate, where the plurality of electrical conductors may be disposed on at least one active surface perimeter overhang region of each of the plurality of level-two IC dies. According to various examples, the plurality of electrical conductors may be at least one of soldering bumps, soldering balls, pillars, pins, stud bumps, and/or stacks of stud bumps. The level-one IC die and the plurality of level-two IC dies may be electrically coupled to each other by at least one of electrical interconnections in the substrate and/or through silicon vias. At least one spacing between two (2) level-two IC dies of the plurality of level-two IC dies may allow the two (2) level-two IC dies to bend or rotate with respect to one another and remain electrically coupled to the substrate in response to warpage of the substrate. At least one spacing between two (2) level-two IC dies of the plurality of level-two IC dies causes a first corner or a first side of a first level-two IC die to move below a second corner of the first level-two IC die in response to concave substrate warpage, and further causes the first corner or the first side of the first level-two IC die to move above the second corner of the first level-two IC die in response to convex substrate warpage. The IC package may be incorporated into at least one of a music player, a video player, an entertainment unit, a navigation device, a communications device, a mobile phone, a smartphone, a personal digital assistant, a fixed location terminal, a tablet computer, and/or a laptop computer.

In one implementation, the plurality of level-two IC dies may comprise two (2) level-two IC dies. In one example, the two (2) level-two IC dies may have at least one of a length and/or a width that is different from one another. In another example, the two (2) level-two IC dies may be substantially identical in size. According to one aspect, each of the two (2) level-two IC dies may include three sides having an active surface perimeter overhang region that includes a plurality of electrical conductors that electrically couple each of the two (2) level-two IC dies to the substrate. Each of the two (2) level-two IC dies may include at least one side, a portion of which, is positioned directly above a back side surface of the level-one IC die and lacks the plurality of electrical conductors.

In another implementation, the plurality of level-two IC dies comprises four (4) level-two IC dies. In one example, each of the four (4) level-two IC dies may include two sides having an active surface perimeter overhang region that includes a plurality of electrical conductors that electrically couple each of the four (4) level-two IC dies to the substrate. Each of the four (4) level-two IC dies may include at least two sides, a portion of each of which is positioned directly above a back side surface of the level-one IC die and lacks the plurality of electrical conductors.

The IC package may also include a plurality of level-three IC dies stacked above the level-two IC dies. The plurality of level-three IC dies may each have an active surface that is electrically coupled to the substrate. The plurality of level-three IC dies may be arranged side by side such that the active surfaces of the plurality of level-three IC dies are positioned substantially in another same plane.

A method for manufacturing a multi-chip integrated circuit (IC) package is also provided. A substrate is provide or formed and a surface of a level-one IC die is electrically coupled to the substrate. A plurality of level-two IC dies are stacked above the level-one IC die, with the plurality of level-two IC dies each having an active surface that is electrically coupled to the substrate. The plurality of level-two IC dies may be arranged side by side such that the active surfaces of the plurality of level-two IC dies are positioned substantially in a same plane. The plurality of level-two IC dies are electrically coupled to the substrate with a plurality of electrical conductors, the plurality of electrical conductors disposed on at least one active surface perimeter overhang region of each of the plurality of level-two IC dies.

The plurality of level-two IC dies may comprise two (2) level-two IC dies. In one example, each of the two (2) level-two IC dies may include three sides having an active surface perimeter overhang region that includes a plurality of electrical conductors that electrically couple each of the two (2) level-two IC dies to the substrate. Each of the two (2) level-two IC dies may include at least one side, a portion of which, is positioned directly above a back side surface of the level-one IC die and lacks the plurality of electrical conductors.

In another example, the plurality of level-two IC dies may comprise four (4) level-two IC dies. Each of the four (4) level-two IC dies may include two sides having an active surface perimeter overhang region that includes a plurality of electrical conductors that electrically couple each of the four (4) level-two IC dies to the substrate. Each of the four (4) level-two IC dies may include at least two sides, a portion of each of which is positioned directly above a back side surface of the level-one IC die and lacks the plurality of electrical conductors.

The method may further include (a) stacking a plurality of level-three IC dies above the level-two IC dies, the plurality of level-three IC dies each having an active surface that is electrically coupled to the substrate, and/or (b) arranging the plurality of level-three IC dies side by side such that the active surfaces of the plurality of level-three IC dies are positioned substantially in another same plane.

The method may further include: (a) providing at least one spacing between two (2) level-two IC dies of the plurality of level-two IC dies that allows the two (2) level-two IC dies to bend or rotate with respect to one another and remain electrically coupled to the substrate in response to warpage of the substrate, and/or (b) providing at least one spacing between two (2) level-two IC dies of the plurality of level-two IC dies that causes a first corner or a first side of a first level-two IC die to move below a second corner of the first level-two IC die in response to concave substrate warpage, and that further causes the first corner or the first side of the first level-two IC die to move above the second corner of the first level-two IC die in response to convex substrate warpage.

DETAILED DESCRIPTION

Figure 1:
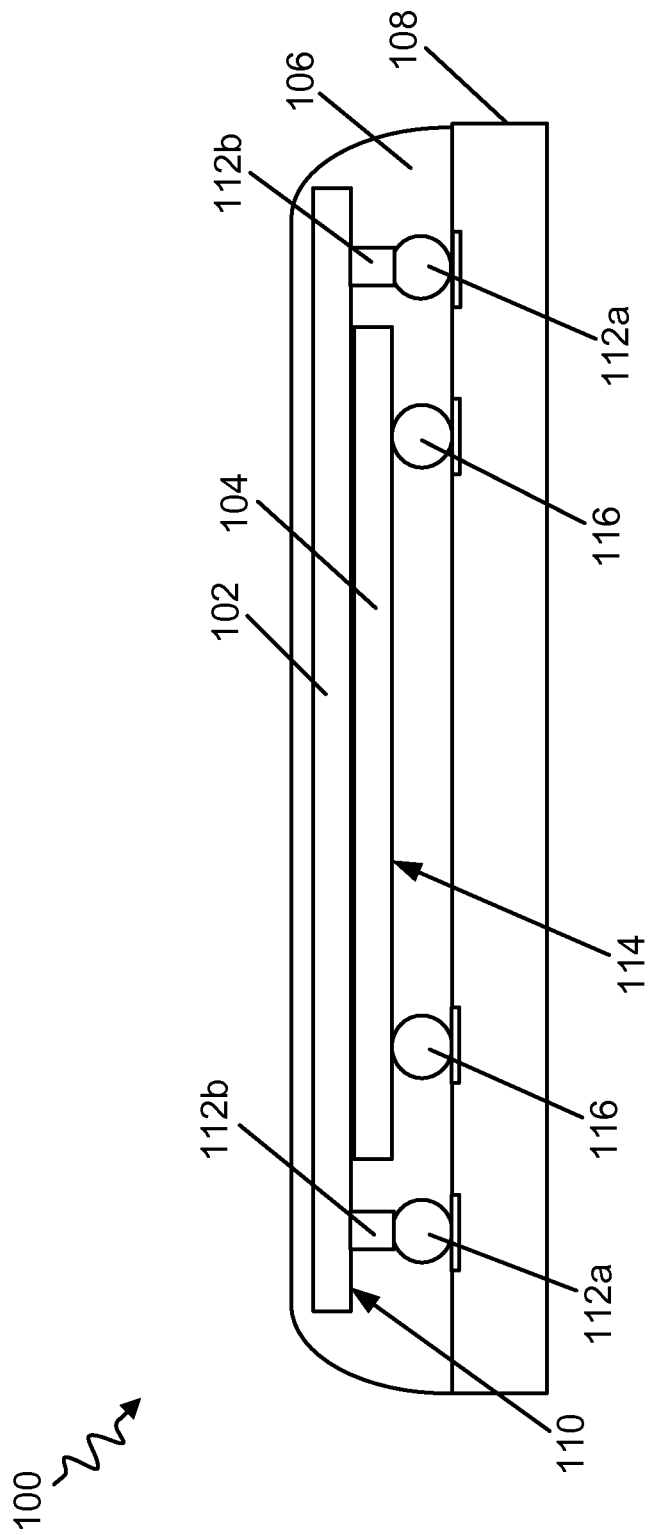
FIG. 1 illustrates a schematic, cross-sectional side view of a system-on-package (SIP) found in the prior art.
Figure 2:
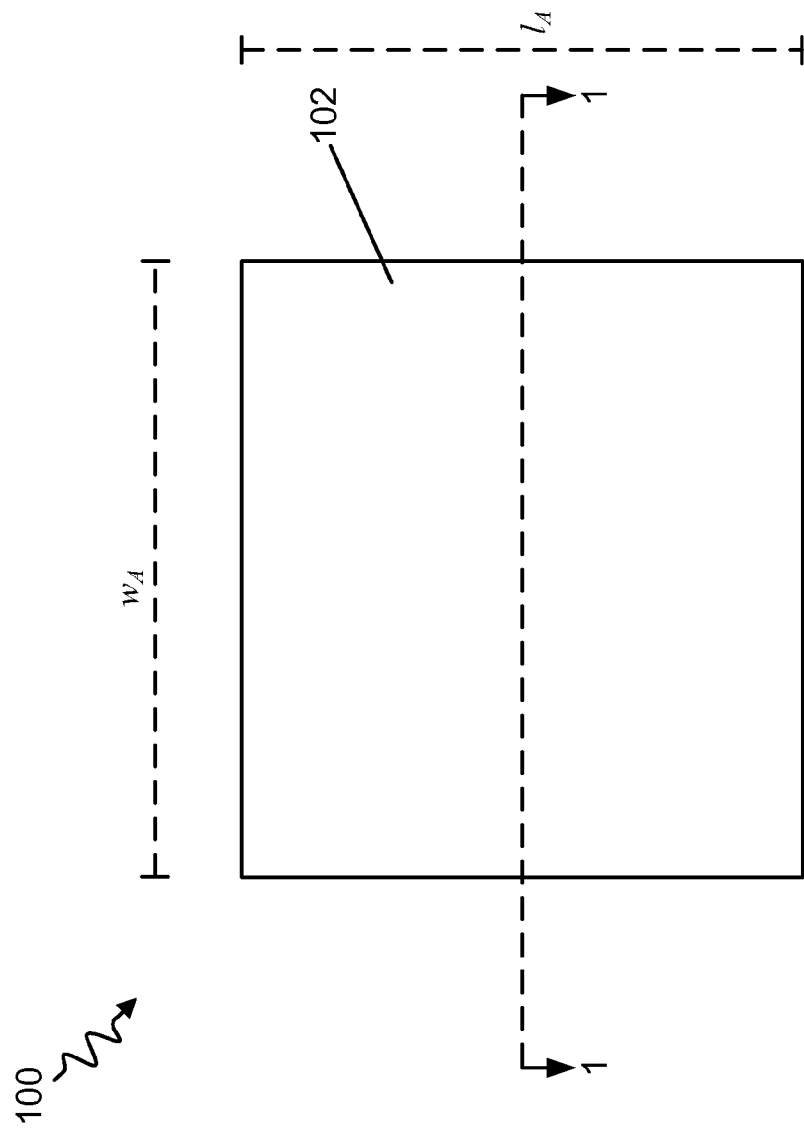
FIG. 2 illustrates a schematic, top view of the SIP package with the molding compound removed thereby exposing the top IC die underneath.
Figure 3:
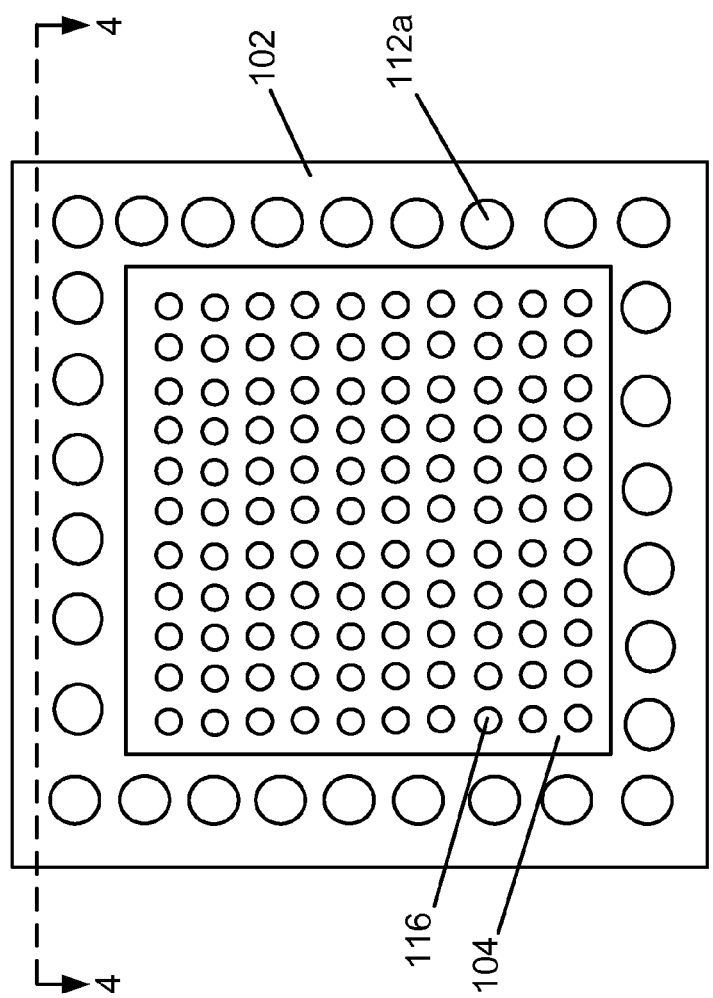
FIG. 3 illustrates a schematic, bottom view of the SIP package.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. As used herein, the terms "electrically coupled" is used herein to refer to the direct or indirect coupling between two objects that allows for the flow of electrical current to take place between the two objects. For example, if object A physically touches object B, and object B touches object C, then objects A and C may still be considered electrically coupled to one another—even if they do not directly physically touch each other—if object B is a conductor that allows for the flow of electrical current to take place from object A to object C and/or from object C to object A.

The term "horizontal" is defined as a plane substantially parallel to the conventional plane and/or surface of an IC package substrate upon which IC dies are coupled to, regardless of the orientation of the package substrate. The term "vertical" refers to a direction substantially perpendicular to the horizontal plane as defined above. Prepositions, such as "above," "below," "upper," "higher," "lower," "over," "under," "underneath," and "on," when used with respect to the IC packages described herein, are defined with respect to the horizontal plane regardless of the absolute orientation of the package substrate. Thus, if a first IC die is positioned above a second IC die, then the second IC die is physically closer to the aforementioned package substrate surface than the first IC die. Prepositions, such as "next to," "side by side," and "adjacent to," when used with respect to IC packages described herein, are defined with respect to the vertical direction regardless of the absolute orientation of the package substrate. Thus, if a first and a second IC die are positioned side by side, then both IC dies may be the same distance away from the aforementioned package substrate surface, but are located at different distances from a vertical plane that is perpendicular to the aforementioned package substrate surface.

Note that while various examples herein may describe IC dies in flip chip configuration, the IC features, configurations, and/or arrangements noted may also be implemented with IC dies in wire bonded configurations.

Overview

A multi-chip integrated circuit (IC) package is provided which is configured to protect against failure due to warpage. The IC package may comprise a substrate, a level-one IC die and a plurality of level-two IC dies. The level-one IC die having a surface that is electrically coupled to the substrate. The plurality of level-two IC dies is stacked above the level-one IC die. The plurality of level-two IC dies may each have an active surface that is electrically coupled to the substrate. The plurality of level-two IC dies may be arranged side by side such that the active surfaces of the plurality of level-two IC dies are positioned substantially in a same plane. Relative to a single die configuration, the level-two IC dies are separated thereby inhibiting cracking, peeling and/or other potential failures due to warpage of the IC package.

Two Level Multi-chip Package

Figure 5:
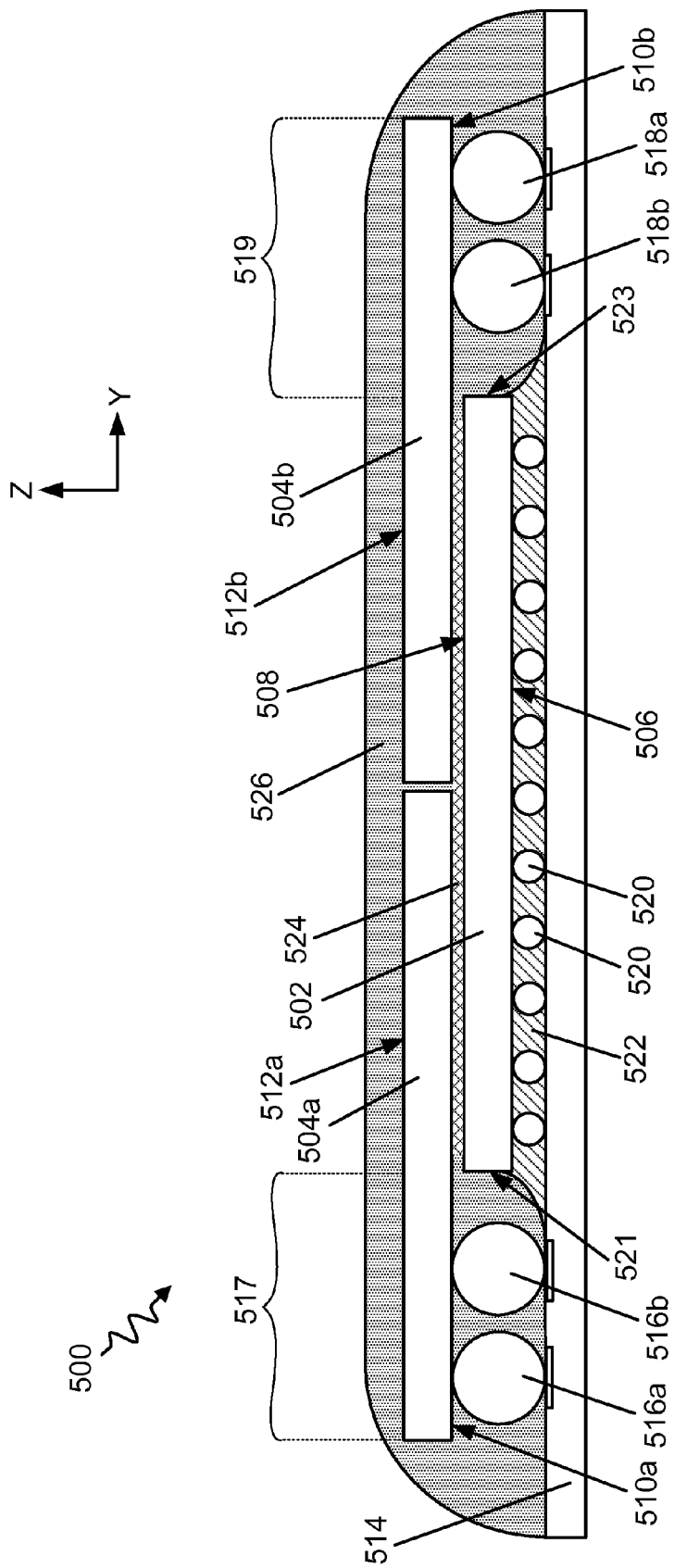
FIG. 5 illustrates a schematic, cross-sectional side view of a stacked multi-chip IC package according to one aspect of the disclosure.

FIG. 5 illustrates a schematic, cross-sectional side view of a stacked multi-chip IC package 500 according to one aspect of the disclosure. The two level IC package 500 comprises a level-one IC die 502 (also referred to herein as "bottom IC die") and two (2) level-two IC dies 504a, 504b all of which may be made of semiconductor materials, such as, but not limited to, silicone and/or germanium. The IC dies 502, 504a, 504b may be any type of IC, such as, but not limited to, processing circuits, memory circuits, or a combination thereof. In one aspect, the level-one IC die 502 is an IC that is substantially a processing circuit, and the level-two dies 504a, 504b are memory circuits, such as double data rate type three (DDR3) synchronous dynamic random access memory (SDRAM) circuits. Of course, in other aspects, the dies 502, 504a, 504b may be other types of processing and/or memory circuits.

The level-one IC die 502 has an active surface side 506 (e.g., front side surface) that includes a plurality of integrated circuit components (e.g., transistors, capacitors, inductors, resistors, etc.). Similarly, the level-two IC dies 504a, 504b each have an active surface side 510a, 510b, (e.g., front side surface) that includes a plurality of integrated circuit components (e.g., transistors, capacitors, inductors, resistors, etc.). The dies 502, 504a, 504b may each have a back side surface 508, 512a, 512b as well. The active surface 510a of the first level-two IC die 504a may be electrically coupled to a package substrate 514 (e.g., laminate substrate, metal based substrate, such as copper based substrate, etc.) that it faces via a plurality of electrical conductors 516a, 516b. Similarly, the active surface 510b of the second level-two IC die 504b may be electrically coupled to the substrate 514 that it faces via another plurality of electrical conductors 518a, 518b. Specifically, the electrical conductors 516a, 516b, 518a, 518b are disposed on active surface perimeter overhang regions 517, 519 of the dies 504a, 504b. It will be understood that in an alternative embodiment, any or all of the electrical conductors 516a, 516b, 518a, 518b may be first disposed on the package substrate 514 and then attached to the active surface perimeter overhang regions 517, 519 of the dies 504a, 504b. The active surface perimeter overhang regions 517, 519 define active surface 510a, 510b areas near the perimeter of the dies 504a, 504b that extend past the side edges 521, 523 of the level-one IC die 502, and thus create overhangs.

The active surface 506 of the level-one IC die 502 may also be electrically coupled to the substrate 514 that it faces via a plurality of smaller electrical conductors 520. In the illustrated example, the electrical conductors 516a, 516b, 518a, 518b, 520 are soldering balls, and thus the IC dies 502, 504a, 504b may be electrically coupled to the substrate 514 in a ball grid array (BGA) flip chip fashion. However, the electrical conductors 516a, 516b, 518a, 518b, 520 are not limited to soldering balls, and may be any metal, metal alloy, or conductive element that is capable of readily transmitting an electrical signal. For example, the electrical conductors 516a, 516b, 518a, 518b, 520 may be, but are not limited to, soldering bumps, pillars, pins, stud bumps, and/or stacks of stud bumps. In one aspect, the IC dies 502, 504a, 504b may electrically communicate with one another by transmitting and receiving electrical signals via interconnections within the multi-layer package substrate 514. In another aspect, the level-one IC die 502 may be electrically coupled to the level-two IC dies 504a, 504b using through substrate vias (TSV). For example, level-one IC die 502 may have both a front side (not labeled) and a back side 508. The front side of the level-one IC die 502 faces the smaller electrical conductors 520 and the back side of level-one IC die faces IC dies 512a and 512b. Thus, TSV elements (not shown) may pass through the back side surface 508 of the level-one IC die 502 and electrically couple with the active surfaces 510a, 510b of the level-two IC dies 504a, 504b. Consequently, the stacked IC dies may electrically communicate with each other through the substrate or through TSVs.

Moreover, the active surface 506 of the level-one IC die 502 may be physically secured to the substrate 514 with die attach and/or underfill adhesive 522. According to one aspect an adhesive material 524 may be used to secure the level-one IC die 502 to the level-two IC dies 504a, 504b. Finally, an epoxy and/or resin molding compound 526 encases the dies 502, 504a, 504b, the electrical conductors 516a, 516b, 518a, 518b, 520, the underfill 522, and other components to form the package 500. The molding compound 526 may also partially cover the package substrate 514.

Figure 6:
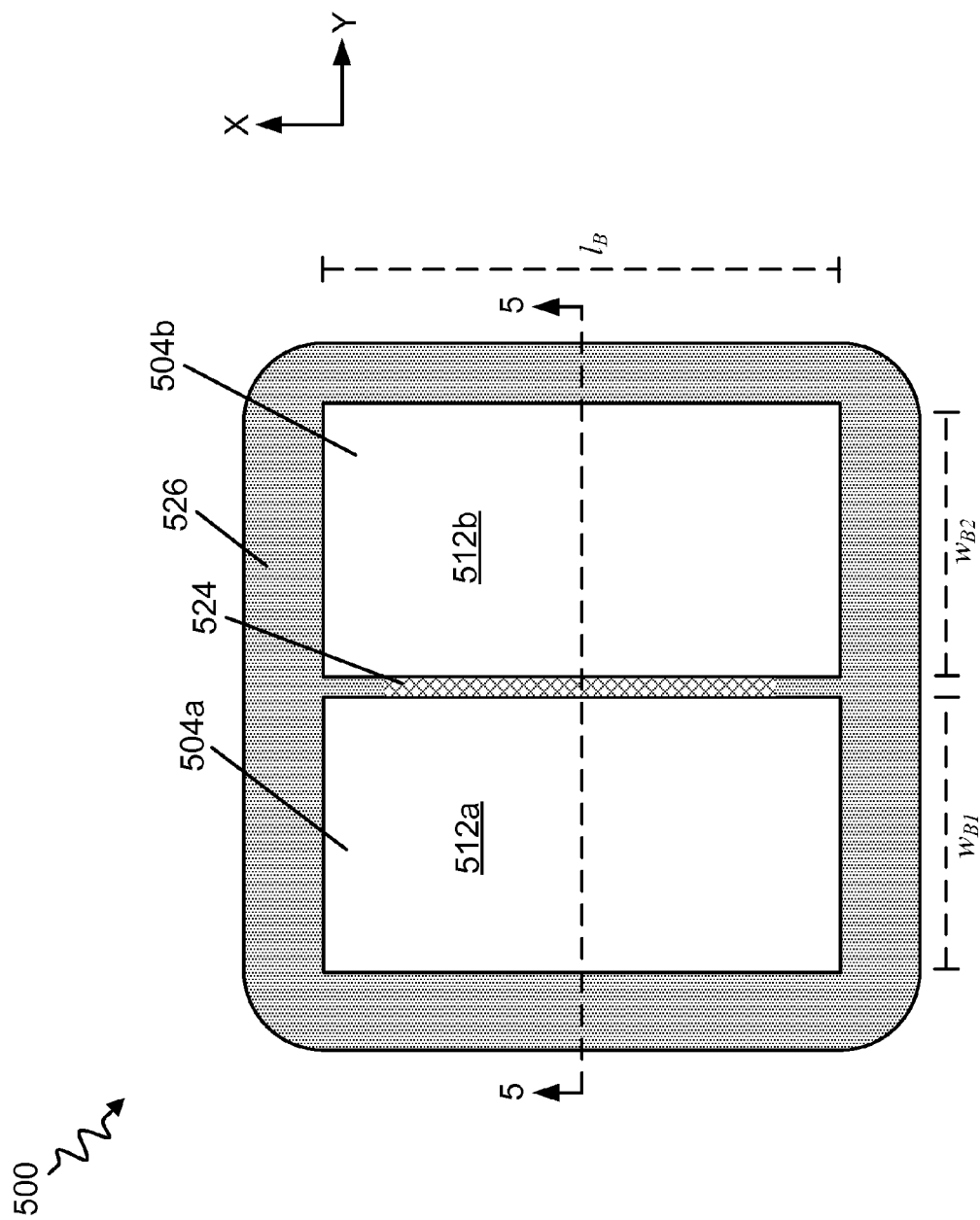
FIG. 6 illustrates a schematic, top view of the IC package according to one aspect.

In this fashion, the level-two IC dies 504a, 504b are positioned substantially side by side in the same planar region (e.g., in the X-Y plane as shown in FIG. 6) and are each positioned above the level-one IC die 502. For example, the IC dies 504a, 504b may be positioned side by side such that their active surfaces 510a, 510b are substantially in the same plane. As will be discussed in greater detail below, having two or more IC dies 504a, 504b that are each smaller (e.g., have less surface area and/or have less length and/or width) than a single, large top IC die 102 (See FIG. 1) having the same number of active components offers distinct advantages.

FIG. 6 illustrates a schematic, top view of the IC package 500 according to one aspect. A portion of the molding compound 526 has been removed to illustrate the level-two IC dies 504a, 504b and the adhesive material 524 underneath. As shown in FIG. 6, the level-two IC dies 504a, 504b are positioned side by side in the X-Y plane. The first level-two IC die 504a has a length $l_B$ and a width $w_{B1}$, and the second level-two IC die 504b has a length $l_B$ and a width $w_{B2}$. According to one aspect, the widths $w_{B1}$ and $w_{B2}$ are each less than the width $w_A$ of the IC package 100 (See FIG. 1) having a single, large top IC die 102. In one aspect, $w_{B1}$ and $w_{B2}$ are each less than half of the width $w_A$.

Figure 7:
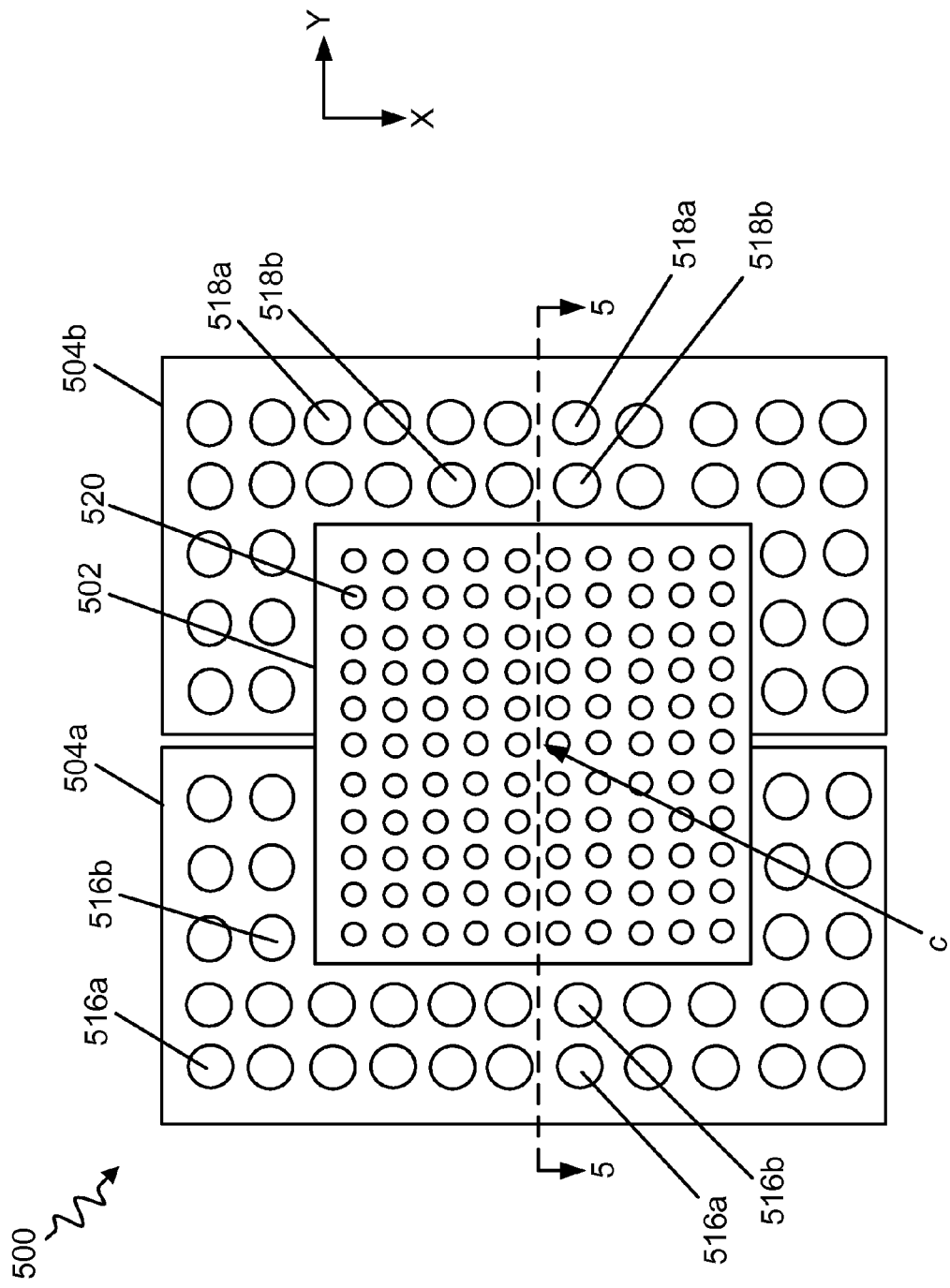
FIG. 7 illustrates a schematic, bottom view of the IC package according to one aspect.

FIG. 7 illustrates a schematic, bottom view of the IC package 500 according to one aspect. The molding compound 526, underfill 522, and substrate 514 have been omitted for clarity. As illustrated in FIG. 7, the plurality of electrical conductors 516a, 516b and 518a, 518b that electrically couple the level-two IC dies 504a, 504b to the substrate 514 (not shown in FIG. 7), respectively, may be arranged around perimeter regions of the level-two IC dies 504a, 504b. For example, the level-two die 504a may have a plurality of inner perimeter region electrical conductors 516b that electrically couple the level-two die 504a to the substrate 514 (not shown in FIG. 7). The level-two die 504a may also have a plurality of outer perimeter region electrical conductors 516a that also electrically couple the level-two die 504a to the substrate 514 (not shown in FIG. 7). The inner perimeter region electrical conductors 516b are closer to center region c of the package 500 than the outer perimeter region electrical conductors 516a. Similarly, the level-two die 504b may have a plurality of inner perimeter region electrical conductors 518b that electrically couple the level-two die 504b to the substrate 514 (not shown in FIG. 7). The level-two die 504b may also have a plurality of outer perimeter region electrical conductors 518a that also electrically couple the level-two die 504b to the substrate 514 (not shown in FIG. 7). The inner perimeter region electrical conductors 518b are closer to center region c of the package 500 than the outer perimeter region electrical conductors 518a. Although the illustrated example shows only two (e.g., inner and outer) perimeter regions of electrical conductors 516a, 516b, 518a, 518b, each level-two IC die 504a, 504b may be electrically coupled to the substrate 514 (not shown in FIG. 7) with any number of perimeter region electrical conductors, such as three or more.

Figure 8:
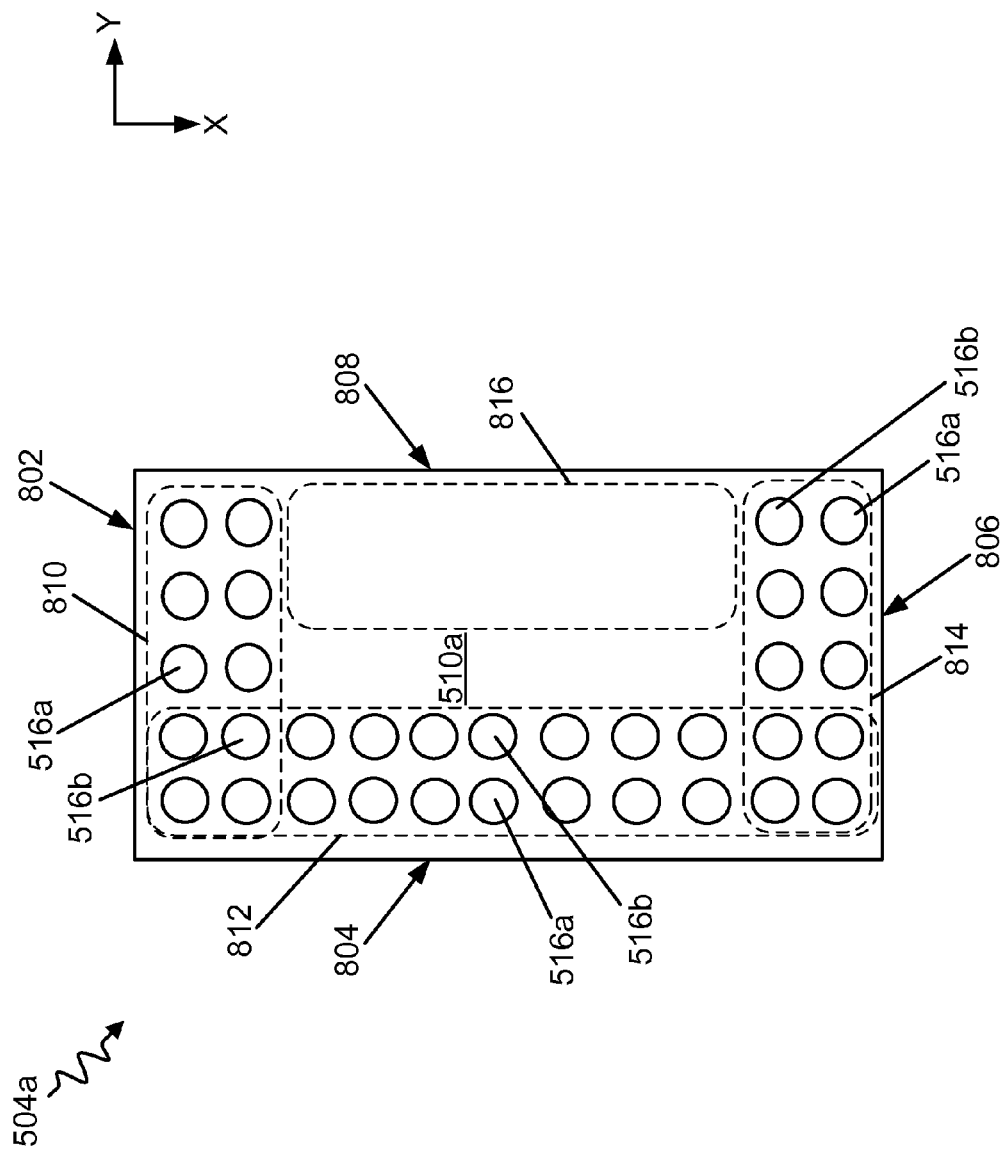
FIG. 8 illustrates a schematic, bottom view of one of the level-two IC dies according to one aspect.

FIG. 8 illustrates a schematic, bottom view of one of the level-two IC dies 504a according to one aspect. The die 504a includes four (4) sides 802, 804, 806, 808. The first side 802 has a first active surface perimeter overhang region 810 associated with it that is near the first side 802 of the die 504a. Similarly, the second side 804 has a second active surface perimeter overhang region 812 associated with it that is near the second side 804 of the die 504a. The third side 806 also has a third active surface perimeter overhang region 814 associated with it that is near the third side 806 of the die 504a. Each of the active surface perimeter overhang regions 810, 812, 814 have a plurality of electrical conductors 516a, 516b disposed thereon that electrically couple the die 504a to the substrate 514. By contrast, the fourth side 808 includes a portion 816 that is positioned directly above the back side surface 508 of the level-one IC die 502 and lacks the electrical conductors 516a, 516b. This allows space in the vertical direction (i.e. Z direction) to accommodate the level-one IC die 502 underneath the level-two IC die 504a (See FIG. 5). The other level-two IC die 504b may have a structure similar to the die 504a just described.

Figure 9:
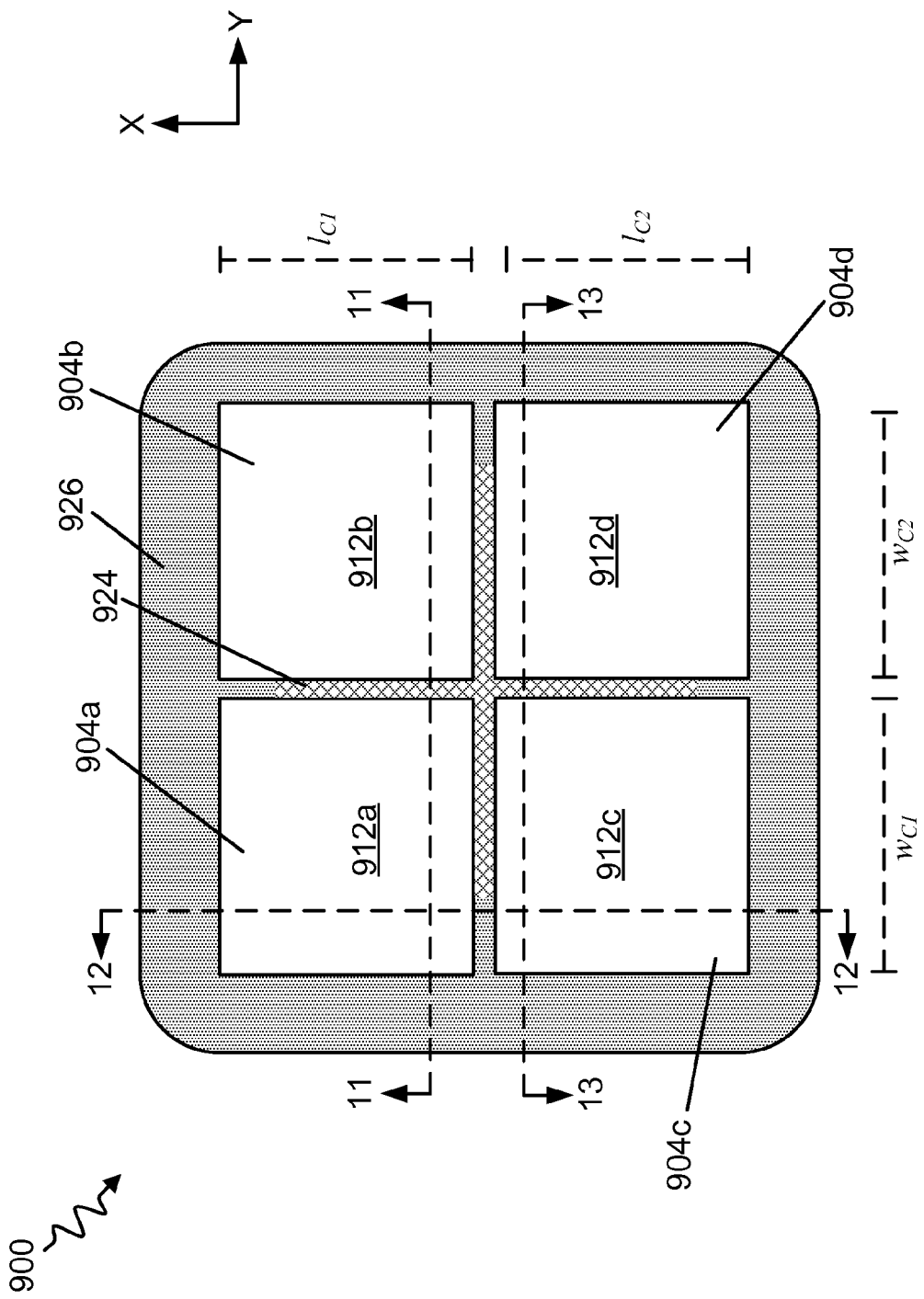
FIG. 9 illustrates a schematic, top view of an IC package according to one aspect.

FIG. 9 illustrates a schematic, top view of an IC package 900 according to one aspect. A portion of the molding compound 926 has been removed to illustrate four (4) level-two IC dies 904a, 904b, 904c, 904d and the adhesive material 924 underneath. As shown in FIG. 9, the level-two IC dies 904a, 904b, 904c, 904d are positioned side by side in the X-Y plane, and each has a back side surface 912a, 912b, 912c, 912d. For example, the dies 904a, 904b, 904c, 904d may be positioned side by side such that their active surfaces 910a, 910b, 910c, 910d (See FIGS. 11-13) are substantially in the same plane. Referring to FIG. 9, the first level-two IC die 904a has a length $l_{C1}$ and a width $w_{C1}$, the second level-two IC die 904b has a length $l_{C1}$ and a width $w_{C2}$, the third level-two IC die 904c has a length $l_{C2}$ and a width $w_{C1}$, and the fourth level-two IC die 904d has a length $l_{C2}$ and a width $w_{C2}$. According to one aspect, the lengths $l_{C1}$, and $l_{C2}$ are each less than the length $l_A$ and widths $w_{C1}$ and $w_{C2}$ are each less than the width $w_A$ of the IC package 100 (See FIG. 1) having a single, large top IC die 102. In one aspect, $w_{C1}$ and $w_{C2}$ are each less than half of the width $w_A$. In another aspect, $l_{C1}$ and $l_{C2}$ are each less than half of the length $l_A$. According to one aspect, $w_{C1}$ is equal to $w_{C2}$ and $l_{C1}$ is equal to $l_{C2}$.

Figure 10:
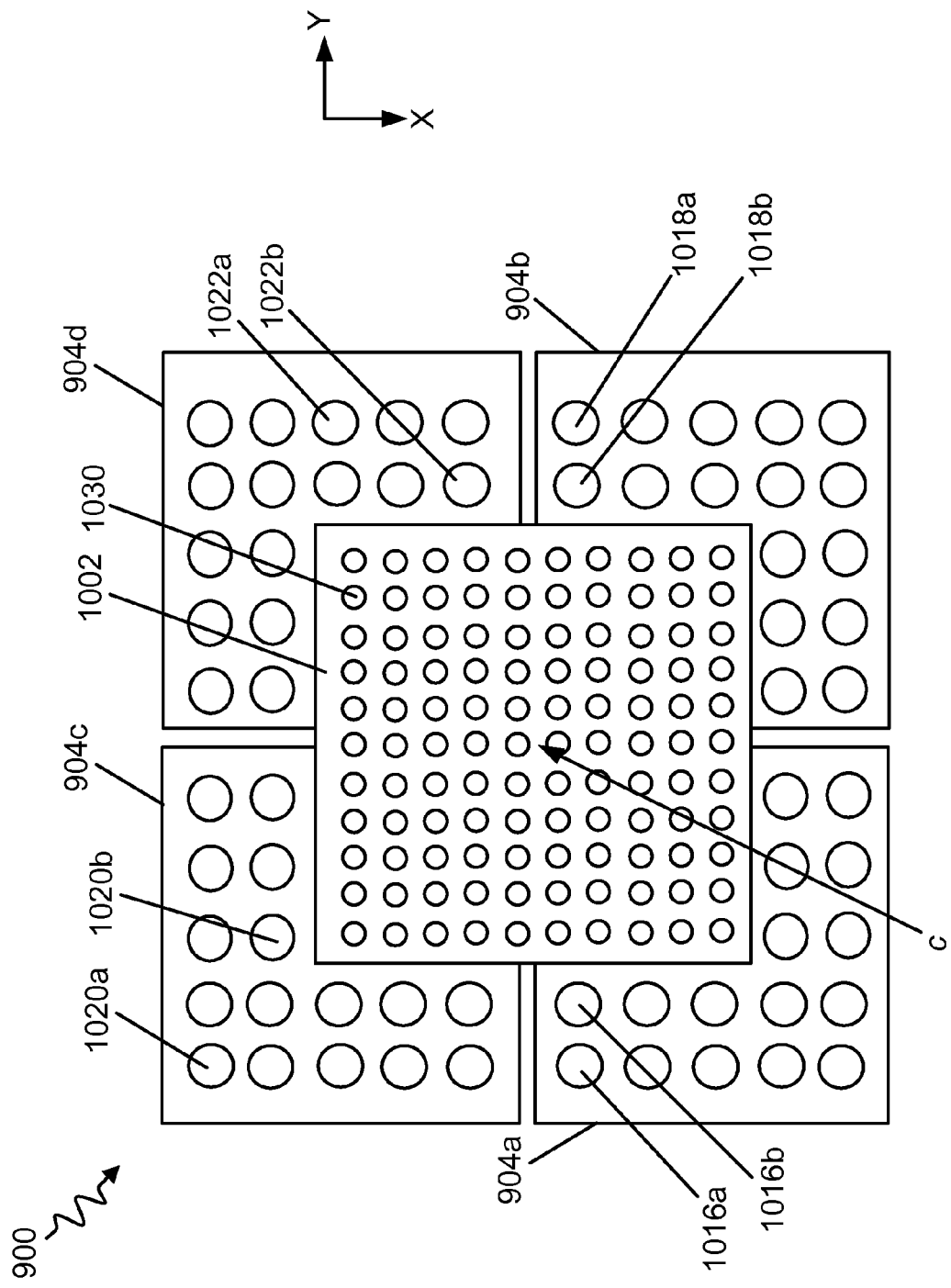
FIG. 10 illustrates a schematic, bottom view of the IC package according to one aspect.

FIG. 10 illustrates a schematic, bottom view of the IC package 900 according to one aspect. Various components of the package 900 have been omitted for clarity. As illustrated in FIG. 10, a plurality of electrical conductors 1016a, 1016b that electrically couple the level-two IC die 904a to the substrate (not shown in FIG. 10) may be arranged around the perimeter region of the dies 904a. For example, the level-two die 904a may have a plurality of inner perimeter region electrical conductors 1016b that electrically couple the level-two die 904a to the substrate. The level-two die 904a may also have a plurality of outer perimeter region electrical conductors 1016a that also electrically couple the level-two die 904a to the substrate. The inner perimeter region electrical conductors 1016b are closer to center region c of the package 900 than the outer perimeter region electrical conductors 1016a. Similarly, a plurality of electrical conductors 1018a, 1018b, 1020a, 1020b, 1022a, 1022b that electrically couple the level-two IC dies 904b, 904c, 904d to the substrate (not shown in FIG. 10) may be arranged around the perimeter regions of the dies 904b, 904c, 904d. For example, the second level-two die 904b may have a plurality of inner perimeter region electrical conductors 1018b that electrically couple the second level-two die 904b to the substrate. The second level-two die 904b may also have a plurality of outer perimeter region electrical conductors 1018a that also electrically couple the second level-two die 904b to the substrate. The inner perimeter region electrical conductors 1018b are closer to center region c of the package 900 than the outer perimeter region electrical conductors 1018a. As illustrated, the third and fourth dies 904c, 904d may have electrical conductors 1020a, 1020b, 1022a, 1022b that are similarly arranged.

Although the illustrated example shows only two (e.g., inner and outer) perimeter regions of electrical conductors 1016a, 1016b, 1018a, 1018b, 1020a, 1020b, 1022a, 1022b each level-two IC die 904a, 904b, 904c, 904d may be electrically coupled to the substrate with any number of perimeter region electrical conductors, such as three or more.

Figure 11:
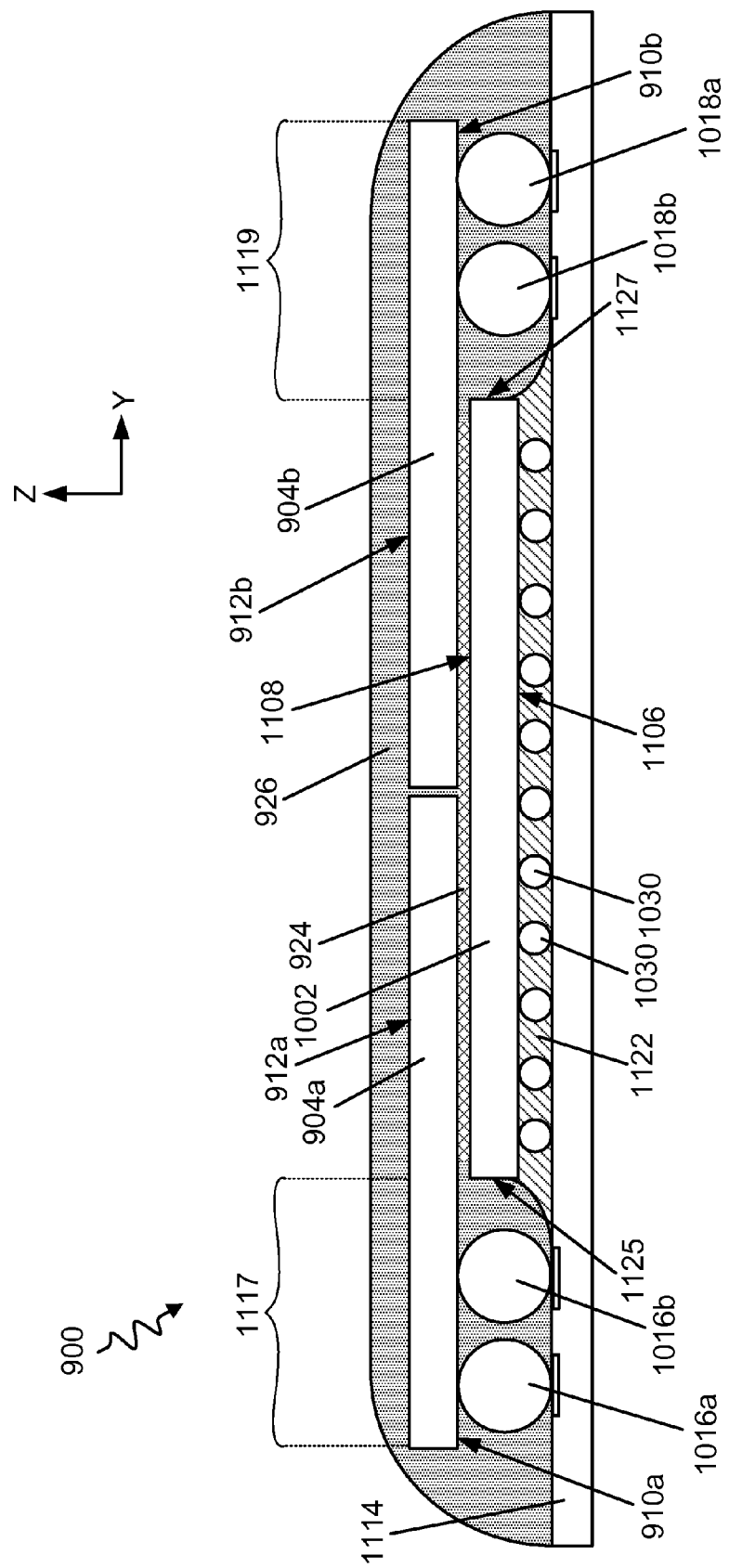
FIGS. 11-13 illustrate a schematic, cross-sectional side views of the stacked multi-chip IC package according to one aspect of the disclosure.
Figure 12:
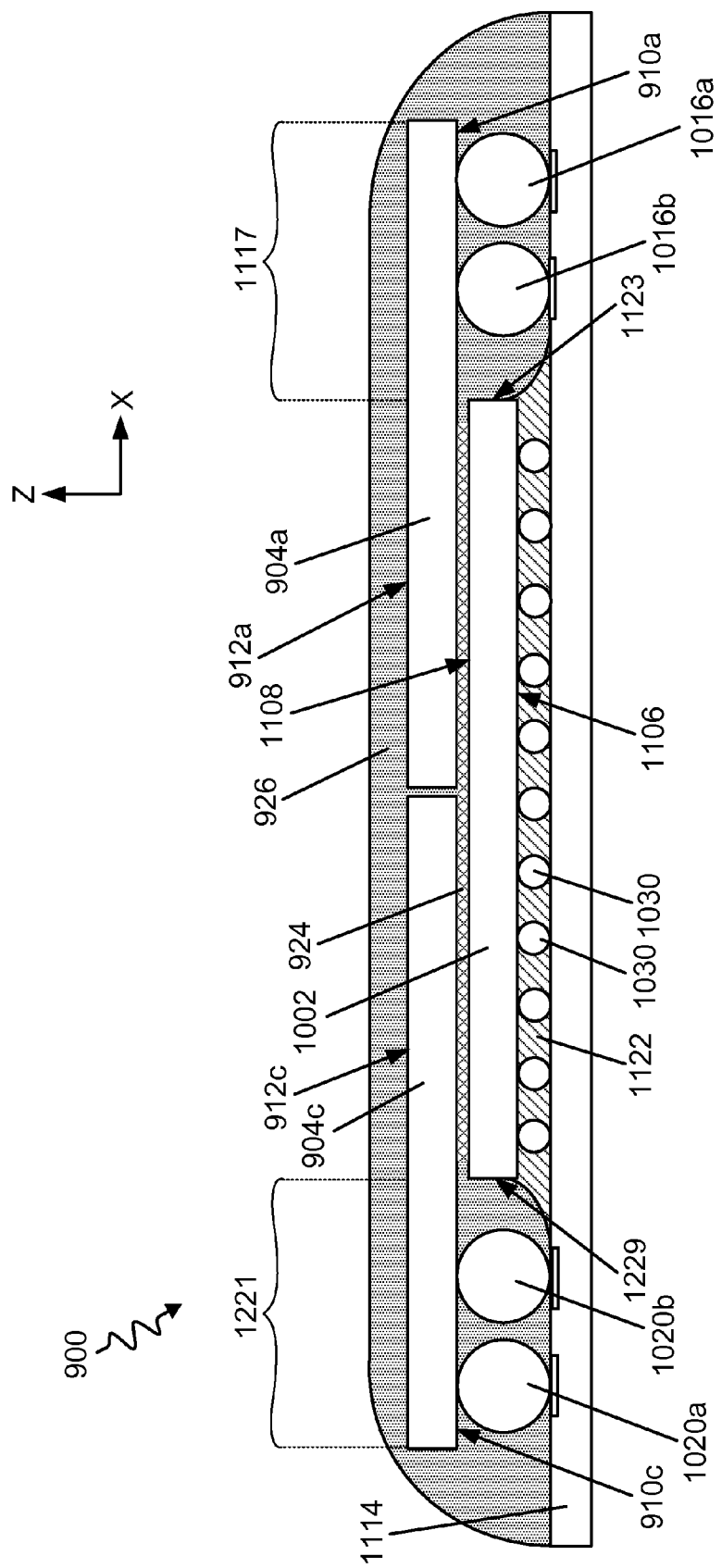
Figure 13:
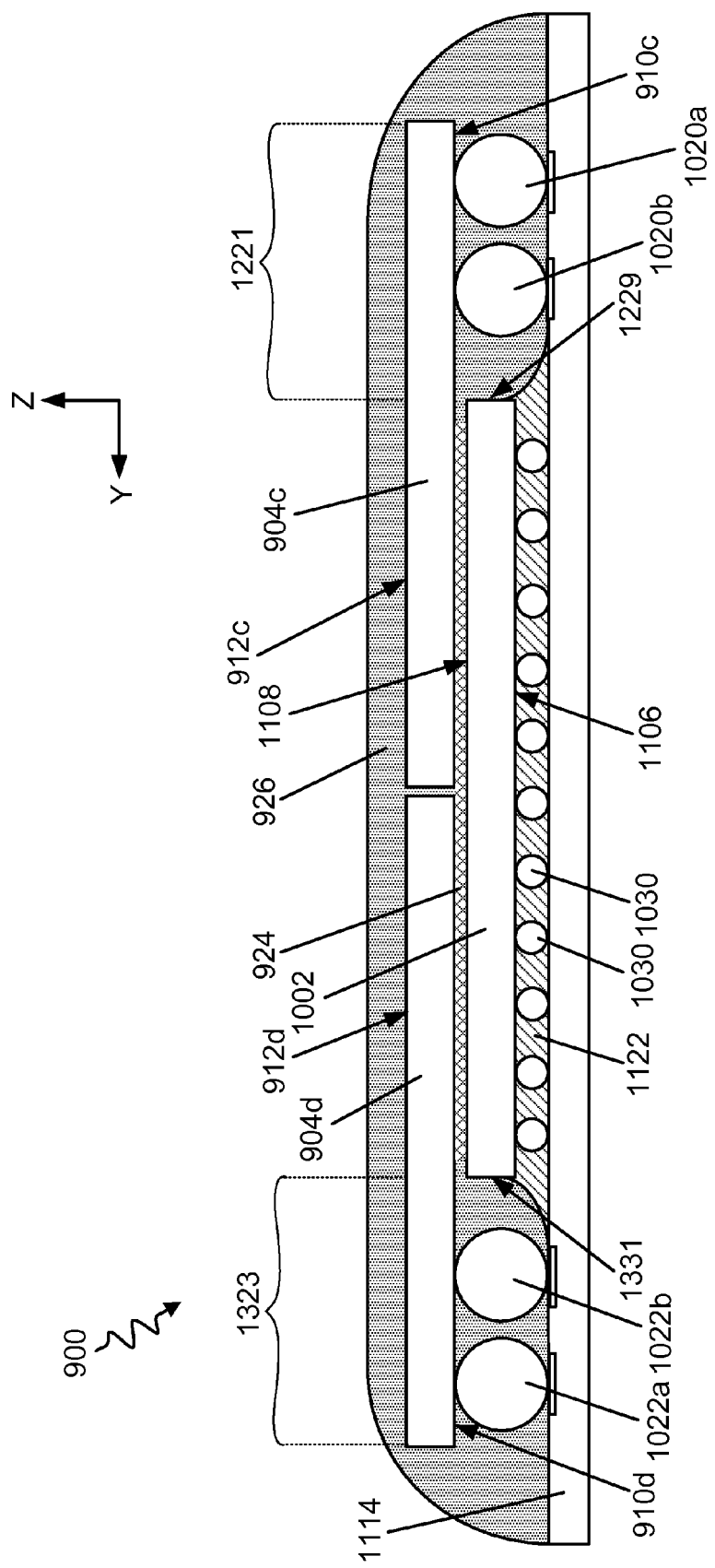

FIGS. 11-13 illustrate a schematic, cross-sectional side views of the stacked multi-chip IC package 900 according to one aspect of the disclosure. The IC package 900 comprises the level-one IC die 1002 and the four (4) level-two IC dies 904a, 904b, 904c, 904d that are made from semiconductor materials, such as, but not limited to, silicone and/or germanium. The IC dies 1002, 904a, 904b, 904c, 904d may be any type of IC, such as, but not limited to, processing circuits, memory circuits, or a combination thereof. In one aspect, the level-one IC die 1002 is an IC that is substantially a processing circuit, and the level-two dies 904a, 904b, 904c, 904d are memory circuits, such as DDR3 DRAM circuits. Of course, in other aspects, the dies 1002, 904a, 904b, 904c, 904d may be other types of processing and/or memory circuits.

The level-one IC die 1002 has an active surface side 1106 (e.g., front side surface) that includes a plurality of integrated circuit components (e.g., transistors, capacitors, inductors, resistors, etc.). Similarly, the level-two IC dies 904a, 904b, 904c, 904d each have an active surface side 910a, 910b, 910c, 910d (e.g., front side surface) that includes a plurality of integrated circuit components (e.g., transistors, capacitors, inductors, resistors, etc.). The dies 1002, 904a, 904b, 904c, 904d may each have a back side surface 1108, 912a, 912b, 912c, 912d as well. The active surface 910a of the first level-two IC die 904a may be electrically coupled to a package substrate 1114 (e.g., laminate substrate, metal based substrate, such as copper based substrate, etc.) that it faces via a plurality of electrical conductors 1016a, 1016b (See FIG. 11). Similarly, the active surface 910b of the second level-two IC die 904b may be electrically coupled to the substrate 1114 that it faces via another plurality of electrical conductors 1018a, 1018b. The active surface 910c of the third level-two IC die 904c may be electrically coupled to the substrate 1114 that it faces via yet another plurality of electrical conductors 1020a, 1020b (See FIG. 12). The active surface 910d of the fourth level-two IC die 904d may be electrically coupled to the substrate 1114 that it faces via another plurality of electrical conductors 1022a, 1022b (See FIG. 13). Specifically, the electrical conductors 1016a, 1016b, 1018a, 1018b, 1020a, 1020b, 1022a, 1022b are disposed on active surface perimeter overhang regions 1117, 1119, 1221, 1323 of the dies 904a, 904b, 904c, 904d. The active surface perimeter overhang regions 1117, 1119, 1221, 1323 define active surface 910a, 910b, 910c, 910d areas near the perimeter of the dies 904a, 904b, 904c, 904d that extend past the side edges 1125, 1127, 1229, 1331 of the level-one IC die 1002, and thus create overhangs.

The active surface 1106 of the level-one IC die 1002 may be electrically coupled to the substrate 1114 that it faces via a plurality of smaller electrical conductors 1030. In one aspect, the IC dies 1002, 904a, 904b, 904c, 904d may electrically communicate with one another by transmitting and receiving electrical signals via interconnections within the multi-layer package substrate 1114. In another aspect, the level-one IC die 1002 may be electrically coupled to the level-two IC dies 904a, 904b, 904c, 904d using through silicon vias (TSV). Thus, TSV elements (not shown) may pass through the back side surface 1108 of the level-one IC die 1002 and electrically couple with the active surfaces 910a, 910b, 910c, 910d of the level-two IC dies 904a, 904b, 904c, 904d.

Moreover, the active surface 1106 of the level-one IC die 1002 may be physically secured to the substrate 1114 with die attach and/or underfill adhesive 1122. According to one aspect an adhesive material 924 may be used to secure the level-one IC die 1002 to the level-two IC dies 902a, 902b, 902c, 902d. Finally, an epoxy and/or resin molding compound 926 encases the dies 1002, 904a, 904b, 904c, 904d, the electrical conductors 1016a, 1016b, 1018a, 1018b, 1020a, 1020b, 1022a, 1022b, 1030, the underfill 1122, and other components to form the package 900. The molding compound 926 may also partially cover the package substrate 1114.

Figure 14:
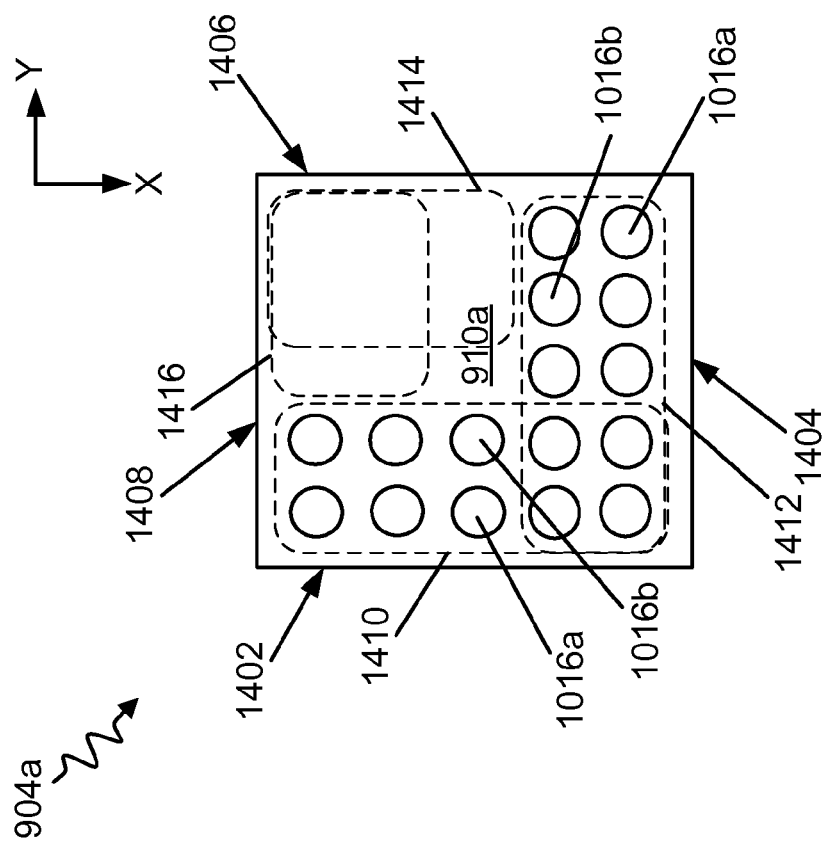
FIG. 14 illustrates a schematic, bottom view of one of the level-two IC dies according to one aspect.

FIG. 14 illustrates a schematic, bottom view of one of the level-two IC dies 904a according to one aspect. The die 904a includes four (4) sides 1402, 1404, 1406, 1408. The first side 1402 has a first active surface perimeter overhang region 1410 associated with it that is near the first side 1402 of the die 904a. Similarly, the second side 1404 has a second active surface perimeter overhang region 1412 associated with it that is near the second side 1404 of the die 904a. Each of the active surface perimeter overhang regions 1410, 1412 have a plurality of electrical conductors 1016a, 1016b disposed thereon that electrically couple the die 904a to the substrate 1114. By contrast, the third side 1406 and the fourth side 1408 include portions 1414, 1416 that are positioned directly above the back side surface 1108 of the level-one IC die 1002 and lack the electrical conductors 1016a, 1016b. This allows space in the vertical direction (i.e. Z direction) to accommodate the level-one IC die 1002 underneath the level-two IC die 904a (See FIG. 11). The other level-two IC dies 904b, 904c, 904d may have structures similar to the die 904a just described.

In this fashion, the level-two IC dies 904a, 904b, 904c, 904d are positioned substantially side by side in the same planar region (e.g., in the X-Y plane as shown in FIGS. 9 and 10) and are each positioned above the level-one IC die 1002. As will be discussed in greater detail below, having four or more IC dies 904a, 904b, 904c, 904d that are each smaller (e.g., have less surface area and/or have less length and/or width) than a single large top IC die 102 (See FIG. 1) having the same number of active components offers distinct advantages.

Figure 15:
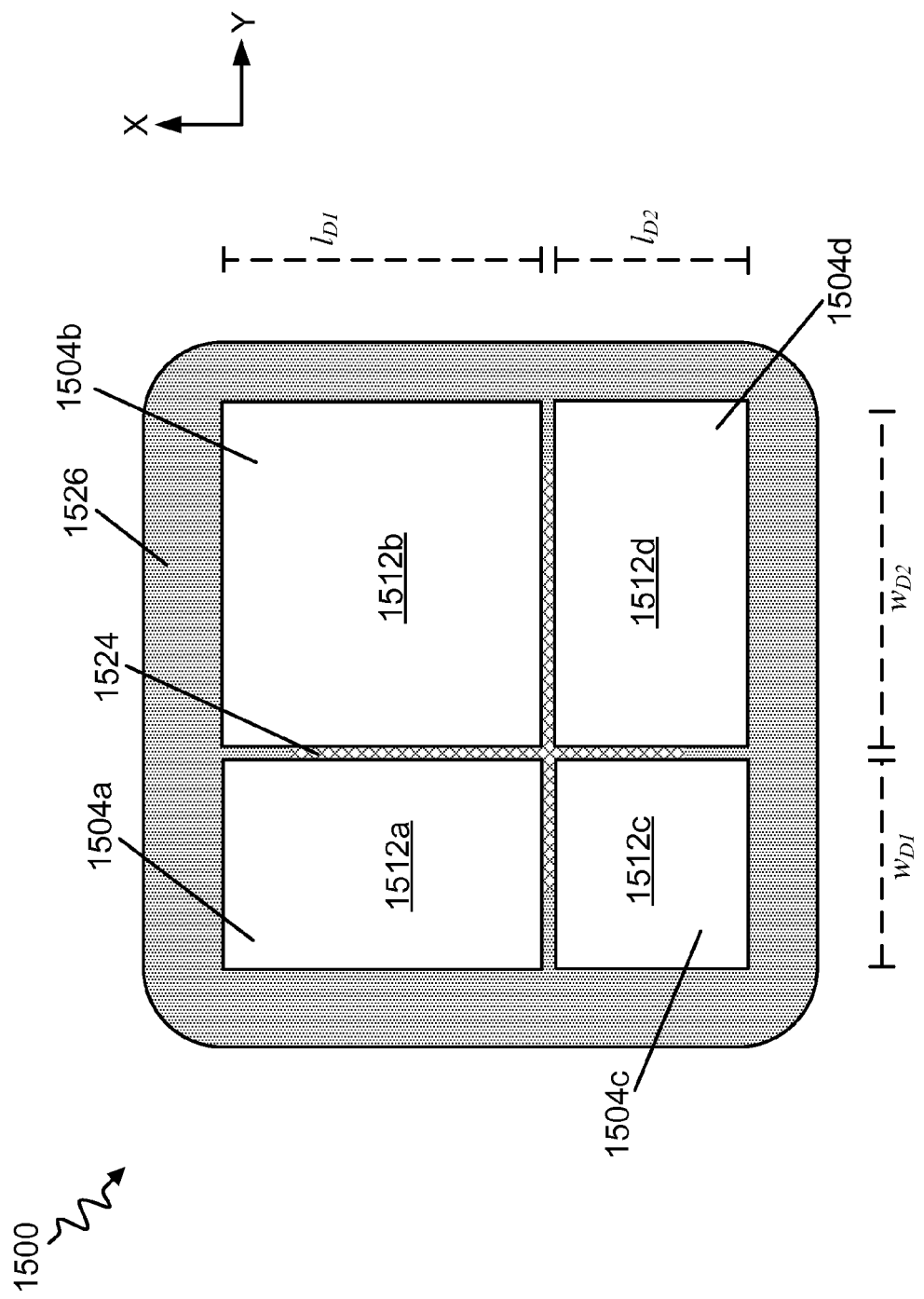
FIG. 15 illustrates a schematic, top view of an IC package according to one aspect.

FIG. 15 illustrates a schematic, top view of an IC package 1500 according to one aspect. A portion of the molding compound 1526 has been removed to illustrate four (4) level-two IC dies 1504a, 1504b, 1504c, 1504d and the adhesive material 1524 underneath. As shown in FIG. 15, the level-two IC dies 1504a, 1504b, 1504c, 1504d are positioned side by side in the X-Y plane, and each has a back side surface 1512a, 1512b, 1512c, 1512d. The first level-two IC die 1504a has a length $l_{D1}$ and a width $w_{D1}$, the second level-two IC die 1504b has a length $l_{D1}$ and a width $w_{D2}$, the third level-two IC die 1504c has a length $l_{D2}$ and a width $w_{D1}$, and the fourth level-two IC die 1504d has a length $l_{D2}$ and a width $w_{D2}$. Notably, unlike the level-two IC dies 904a, 904b, 904c, 904d of FIG. 9, the level-two IC dies 1504a, 1504b, 1504c, 1504d in FIG. 15 each have different dimensions and surface areas compared to each other. For example, according to one aspect $w_{D1}$ is less than $w_{D2}$ and $l_{D2}$ is less than $l_{D1}$. In this fashion the level-two IC dies 1504a, 1504b, 1504c, 1504d may comprises ICs that are each different sizes. According to one aspect, the package 1500 may include two level-two IC dies 1504a, 1504c that are positioned substantially diagonally from one another, but not include the other level-two IC dies 1504b, 1504d. According to another aspect, the package 1500 may include two level-two IC dies 1504b, 1504d that are positioned substantially diagonally from one another, but not include the other level-two IC dies 1504*a*, 1504*c*. According to another aspect, the package 1500 may include three level-two IC dies 1504*a*, 1504*b*, 1504*c*, but not include the other level-two IC die 1504*d*.

Figure 16:
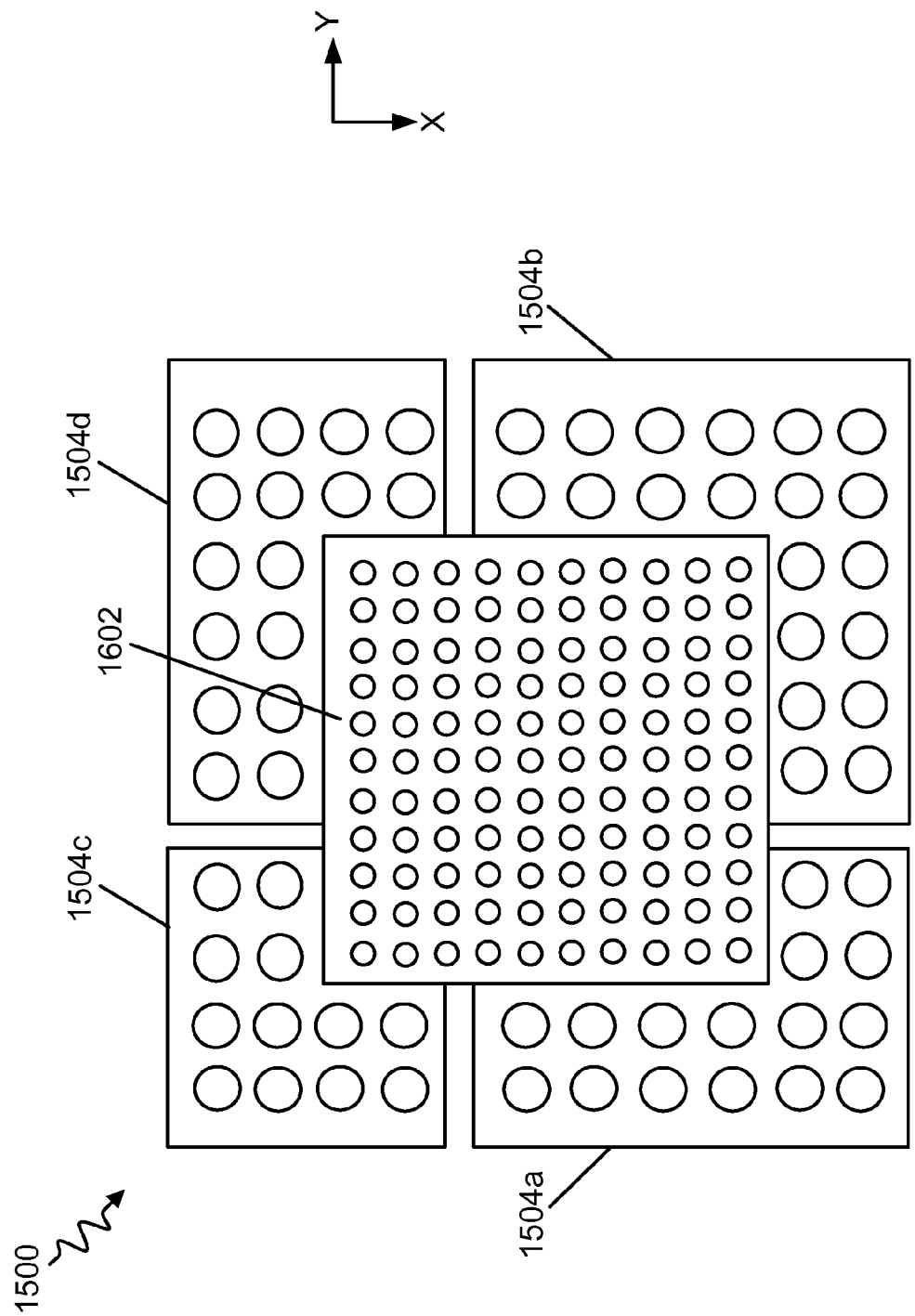
FIG. 16 illustrates a schematic, bottom view of the IC package according to one aspect.

FIG. 16 illustrates a schematic, bottom view of the IC package 1500 according to one aspect. Various components of the package 1500 have been omitted for clarity. As illustrated in FIG. 16, the IC package 1500 also comprises a level-one IC die 1602 that is positioned underneath the level-two IC dies 1504*a*, 1504*b*, 1504*c*, 1504*d*. The adhesive material 1524 (see FIG. 15) helps the level-one IC die 1602 adhere to the level-two IC dies 1504*a*, 1504*b*, 1504*c*, 1504*d*. The IC dies 1602, 1504*a*, 1504*b*, 1504*c*, 1504*d* may also include a plurality of electrical conductors similar to the ones described above with respect to IC package 900.

Three Level Multi-chip Package

Figure 17:
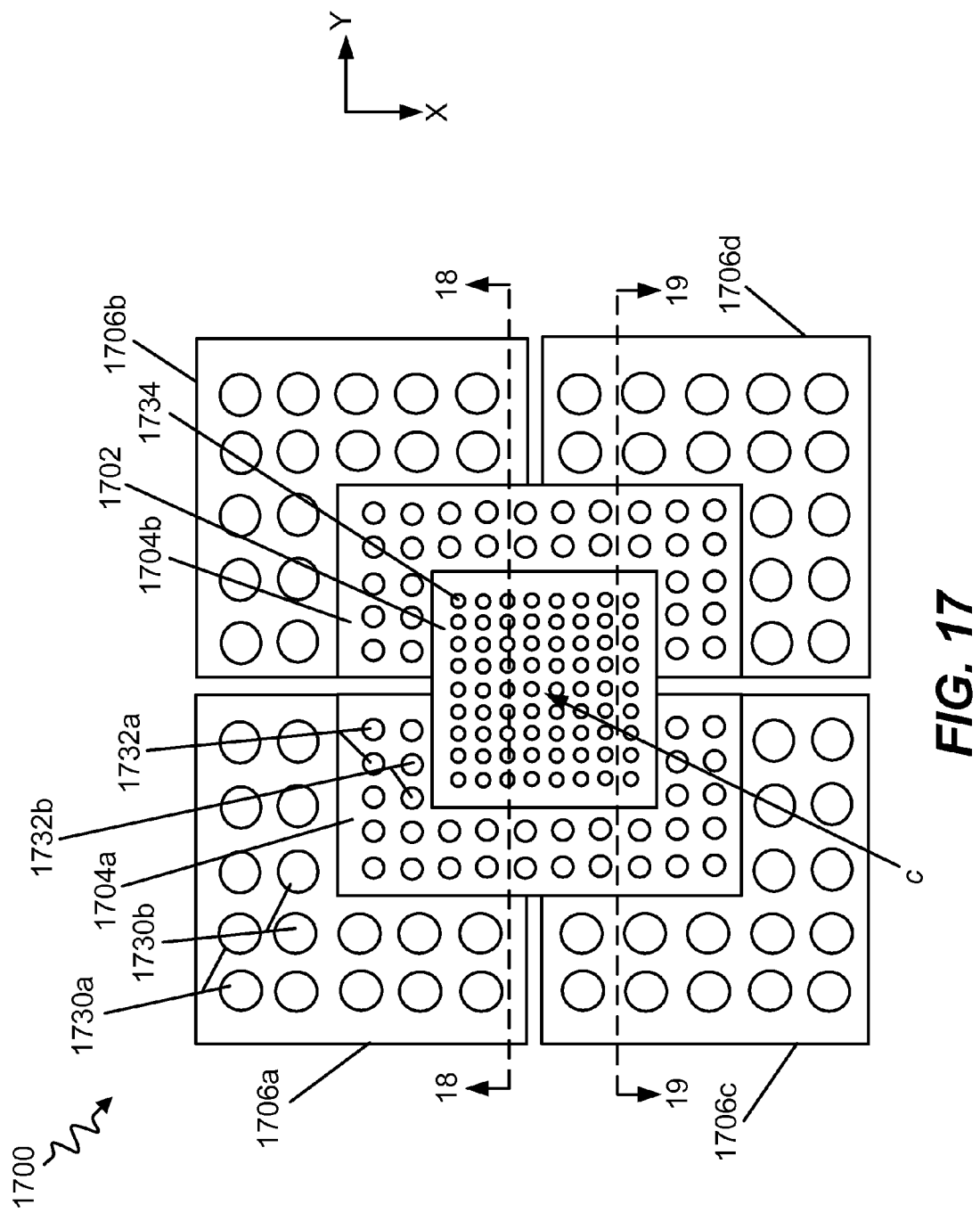
FIG. 17 illustrates a schematic, bottom view of a three level, stacked, multi-chip IC package according to one aspect.

FIG. 17 illustrates a schematic, bottom view of a three level, stacked, multi-chip IC package 1700 according to one aspect. Various components of the package 1700, such as a molding compound that encapsulates the package 1700, have been omitted for clarity. As illustrated in FIG. 17, the IC package 1700 comprises a level-one IC die 1702, a first level-two IC die 1704*a*, a second level-two IC die 1704*b*, a first level-three IC die 1706*a*, a second level-three IC die 1706*b*, a third level-three IC die 1706*c*, and a fourth level-three IC die 1706*d*. The level-one IC die 1702 is positioned underneath the level-two IC dies 1704*a*, 1704*b*, and the level-two IC dies 1704*a*, 1704*b* are positioned underneath the level-three IC dies 1706*a*, 1706*b*, 1706*c*, 1706*d*. The level-two IC dies 1704*a*, 1704*b* are also situated such that they are side by side in the same plane parallel to the X-Y plane orientation shown in FIG. 17. Similarly, the level-three IC dies 1706*a*, 1706*b*, 1706*c*, 1706*d* are also situated such that they are side by side in the same plane parallel to the X-Y plane.

The IC dies 1702, 1704*a*, 1704*b*, 1706*a*, 1706*b*, 1706*c*, 1706*d* may also include a plurality of electrical conductors similar to the ones described above with respect to the IC packages 500, 900 above. For example, the level-one IC die 1702 may include a plurality of electrical conductors 1734 that electrically couple the level-one IC die 1702 to the package substrate (not shown in FIG. 17). The first level-two IC die 1704*a* may include a plurality of electrical conductors 1732*a*, 1732*b* that electrically couple the level-two IC die 1704*a* to the package substrate. Specifically, the first level-two IC die 1704*a* may have a plurality of inner perimeter region electrical conductors 1732*b* and a plurality of outer perimeter region electrical conductors 1732*a*. The inner perimeter region electrical conductors 1732*b* are closer to center region c of the package 1700 than the outer perimeter region electrical conductors 1732*a*. The second level-two IC die 1704*b* may also have an electrical conductor arrangement similar to the first level-two IC die 1704*a*. The first level-three IC die 1706*a* may include a plurality of electrical conductors 1734*a*, 1734*b* that electrically couple the level-three IC die 1706*a* to the package substrate. Specifically, the first level-three IC die 1706*a* may have a plurality of inner perimeter region electrical conductors 1734*b* and a plurality of outer perimeter region electrical conductors 1734*a*. The inner perimeter region electrical conductors 1734*b* are closer to center region c of the package 1700 than the outer perimeter region electrical conductors 1734*a*. The second, third, and fourth level-three IC dies 1706*b*, 1706*c*, 1706*d* may also have electrical conductor arrangements similar to the first level-three IC die 1706*a*.

Figure 18:
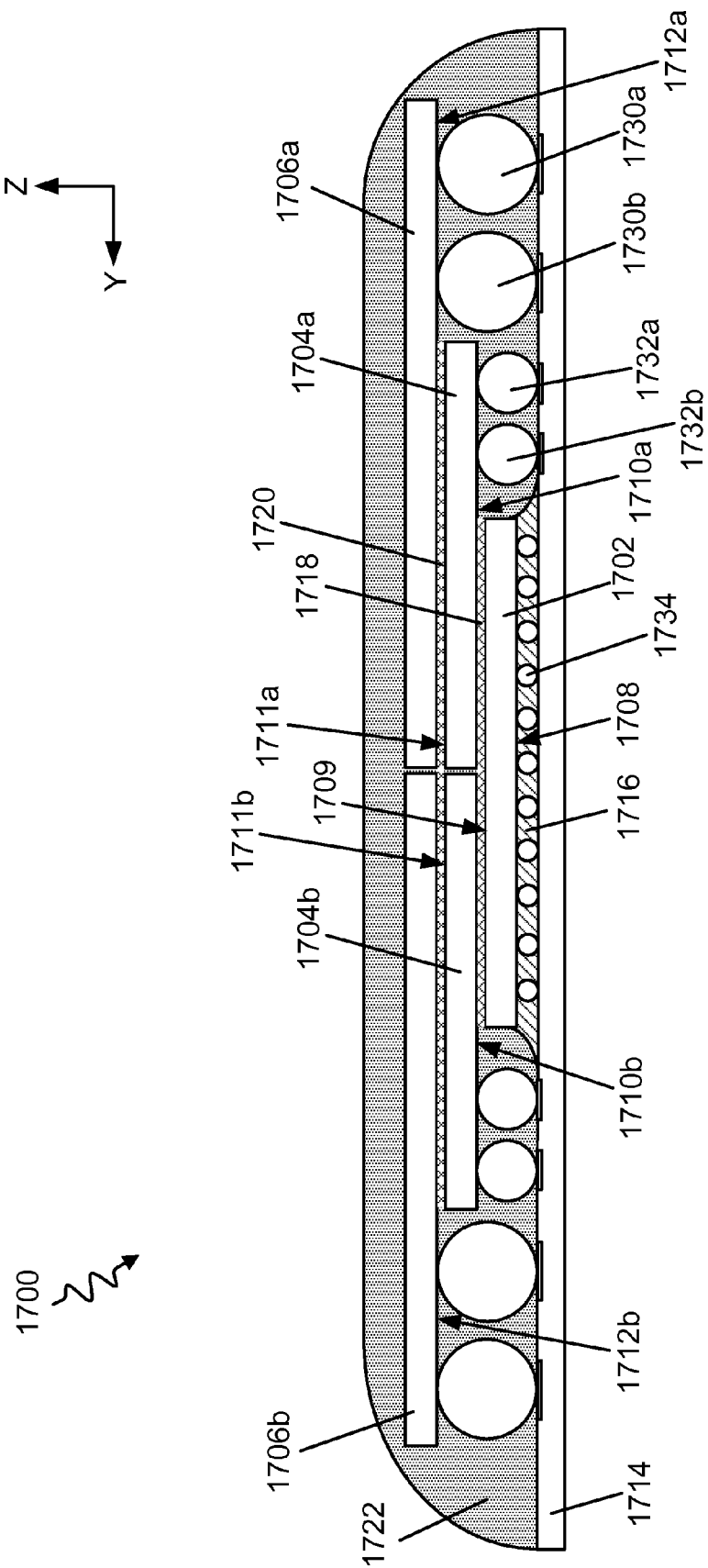
FIGS. 18 and 19 illustrate schematic, cross sectional side views of the three level IC package according to one aspect.
Figure 19:
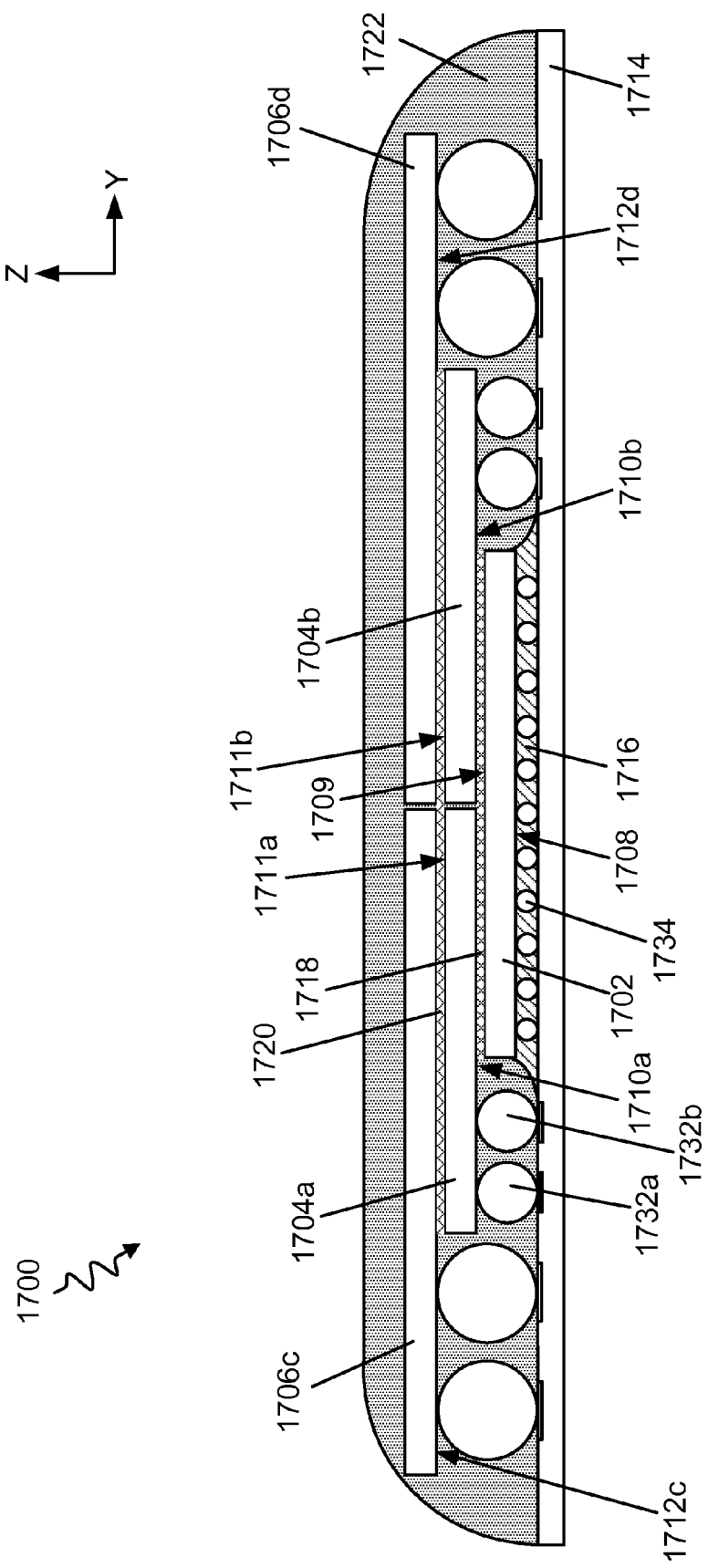

FIGS. 18 and 19 illustrate schematic, cross sectional side views of the three level IC package 1700 according to one aspect. As discussed above with respect to FIG. 17, the IC package 1700 includes the level-one IC die 1702, the first level-two IC die 1704*a*, the second level-two IC die 1704*b*, the first level-three IC die 1706*a*, the second level-three IC die 1706*b*, the third level-three IC die 1706*c*, and the fourth level-three IC die 1706*d*. The level-two IC dies 1704*a*, 1704*b* are arranged side by side in the same plane, as are the level-three IC dies 1706*a*, 1706*b*, 1706*c*, 1706*d*. For example, the level-three IC dies 1706*a*, 1706*b*, 1706*c*, 1706*d* may be arranged side by side such that their active surfaces 1712*a*, 1712*b*, 1712*c*, 1712*d* are substantially in the same plane. In this fashion, the IC package 1700 includes three distinct stacked levels/layers of IC dies. The IC dies 1702, 1704*a*, 1704*b*, 1706*a*, 1706*b*, 1706*c*, 1706*d* may be any type of IC, such as, but not limited to, processing circuits, memory circuits, or a combination thereof. In one aspect, the level-one IC die 1702 is a processing circuit, and the level-two and level-three IC dies 1704*a*, 1704*b*, 1706*a*, 1706*b*, 1706*c*, 1706*d* are memory circuits, such as DDR3 DRAM circuits. Of course, in other aspects, the dies 1702, 1704*a*, 1704*b*, 1706*a*, 1706*b*, 1706*c*, 1706*d* may be other types of processing and/or memory circuits.

The level-one IC die 1702 has an active surface side 1708 (e.g., front side surface) that includes a plurality of integrated circuit components (e.g., transistors, capacitors, inductors, resistors, etc.). Similarly, the level-two IC dies 1704*a*, 1704*b* and the level-three IC dies 1706*a*, 1706*b*, 1706*c*, 1706*d* each have an active surface side 1710*a*, 1710*b* and 1712*a*, 1712*b*, 1712*c*, 1712*d*, respectively, that faces a package substrate 1714 and includes a plurality of integrated circuit components. The active surface 1712*a* of the first level-three IC die 1706*a* may be electrically coupled to the package substrate 1714 (e.g., laminate substrate, metal based substrate, such as copper based substrate, etc.) via a plurality of electrical conductors 1730*a*, 1730*b*. Similarly, the active surfaces 1712*b*, 1712*c*, 1712*d* of the second, third, and fourth level-three IC dies 1706*b*, 1706*c*, 1706*d* may also be electrically coupled to the substrate 1714 through other electrical conductors. The active surface 1710*a* of the level-two IC die 1704*a* may be electrically coupled to the package substrate 1714 via a plurality of electrical conductors 1732*a*, 1732*b*. Similarly, the active surface 1710*b* of the second level-two IC die 1704*b* may also be electrically coupled to the substrate 1714 through electrical conductors. The active surface 1708 of the level-one IC die 1702 may be electrically coupled to the package substrate 1714 via a plurality of electrical conductors 1734. In this way, the IC dies 1702, 1704*a*, 1704*b*, 1706*a*, 1706*b*, 1706*c*, 1706*d* may be electrically coupled to the substrate 1714 in a flip chip fashion, and may electrically communicate with one another by transmitting and receiving electrical signals via interconnections within the multi-layer package substrate 1714. In one aspect, the level-one IC die 1702 and the level-two IC dies 1704*a*, 1704*b* may be electrically coupled with each other and the level-three IC dies 1706*a*, 1706*b*, 1706*c*, 1706*d* using through silicon vias (TSV). Thus, TSV elements (not shown) may pass through the back side surface 1709 of the level-one IC die 1702 and electrically couple with the active surfaces 1710*a*, 1710*b* of the level-two IC dies 1704*a*, 1704*b*. Other TSV elements (not shown) may also pass through the back side surface 1711*a*, 1711*b* of the level-two IC dies 1704*a*, 1704*b* and electrically couple with the active surfaces 1712*a*, 1712*b*, 1712*c*, 1712*d* of the level-three IC dies 1706*a*, 1706*b*, 1706*c*, 1706*d*.

The active surface 1708 of the level-one IC die 1702 may be physically secured to the substrate 1714 with die attach and/or underfill adhesive 1716. According to one aspect an adhesive material 1718 may be used to secure the level-one IC die 1702 to the level-two IC dies 1704*a*, 1704*b*, and more adhesive material 1720 may be used to secure the level-two IC dies 1704a, 1704b to the level-three IC dies 1706a, 1706b, 1706c, 1706d. Finally, an epoxy and/or resin molding compound 1722 encases the dies 1702, 1704a, 1704b, 1706a, 1706b, 1706c, 1706d and the electrical conductors 1730a, 1730b, 1732a, 1732b, 1734, the underfill 1716, and other components to form the package 1700. The molding compound 1722 may also partially cover the package substrate 1714. In some implementations, the level-two IC dies 1704 and level-three IC dies 1706 may also be secured using underfill.

Similar to the level-two IC die 904a, the level-three IC die 1706a includes four (4) sides. The first and second sides have active surface perimeter overhang regions that each have a plurality of electrical conductors disposed thereon that electrically couple the die 1706a to the substrate 1714. By contrast, the third and fourth sides include portions that are positioned directly above the back side surface 1711a of the level-two IC die 1704a and lack electrical conductors. This allows space in the vertical direction (i.e. Z direction) to accommodate the level-two IC die 1704a underneath the level-three IC dies 1706a (See FIGS. 17-18). The other level-three IC dies 1706b, 1706c, 1706d may have structures similar to the die 1706a just described so as to accommodate one or more of the level-two IC dies 1704a, 1704b. The level-two IC dies 1704a, 1704b may have structures similar to the level-two dies 504a, 504b described above with respect to FIG. 8.

Notably, the level-two IC dies 1704a, 1704b are each smaller (i.e., less surface area) than a single, large level-two IC die containing all of the IC components (e.g., transistors, resistors, capacitors, inductors, etc.) of the level-two IC dies 1704a, 1704b. Similarly, dividing the IC components onto four level-three IC dies 1706a, 1706b, 1706c, 1706d rather than placing them all on a single, large level-three IC die has distinct advantages.

In the illustrated examples, the electrical conductors 1016a, 1016b, 1018a, 1018b, 1020a, 1020b, 1022a, 1022b, 1030, 1730a, 1730b, 1732a, 1732b, 1734 are soldering balls, and thus the IC dies 904a, 904b, 904c, 904d, 1002, 1504a, 1504b, 1504c, 1504d, 1602, 1702, 1704a, 1704b, 1706a, 1706b, 1706c, 1706d may be electrically coupled to their respective substrates 1114, 1714 in a ball grid array (BGA) flip chip fashion. However, the electrical conductors 1016a, 1016b, 1018a, 1018b, 1020a, 1020b, 1022a, 1022b, 1030, 1730a, 1730b, 1732a, 1732b, 1734 are not limited to soldering balls, and may be any metal, metal alloy, or conductive element that is capable of readily transmitting an electrical signal. For example, the electrical conductors 1016a, 1016b, 1018a, 1018b, 1020a, 1020b, 1022a, 1022b, 1030, 1730a, 1730b, 1732a, 1732b, 1734 may be, but are not limited to, soldering bumps, pillars, pins, stud bumps, and/or stacks of stud bumps.

Breaking up a single, large upper level IC die (for example IC die 102 in FIG. 1) into multiple dies in order to divide the IC components (transistors, resistors, diodes, capacitors, inductors, etc.) onto the active surfaces of multiple level-two IC dies 504a, 504b, 904a, 904b, 904c, 904d, 1504a, 1504b, 1504c, 1504d, 1704a, 1704b, and multiple level-three IC dies 1706a, 1706b, 1706c, 1706d offer distinct performance advantages. For example, IC component cross-talk plays a dominant role in IC performance. More than 50% of the IC clock and/or data jitter comes from cross-talk. Reducing jitter allows the IC dies to be run at higher clock speeds thereby improving performance of the IC dies and IC package. Dividing the IC components onto multiple level-two and/or level-three IC dies reduces cross-talk, jitter, and clock skew because the IC components are better electrically isolated from one another since they are placed on different dies.

Note that in existing prior art package-on-package (PoP) configurations of multiple ranks, those ranks that belong to a same channel are sharing the DRAM package routing, and are connected to different DRAM die using bonding wires. Also the space between the neighboring bytes are relatively small (minimum space usually) since all bytes for all different ranks have to be routed on an identical DRAM package. In such prior art configurations, the electrical and/or EMI coupling among ranks are very strong. By contrast, the configurations described herein break the DRAM package into multiple packages and rout the DRAM packages for different ranks independently. Also in an individual rank, there may be more space to isolate the routing for each byte, so that these configurations may have less electrical and/or EMI coupling and better jitter performance.

For EMI effects, the answers are similar, multiple package configuration will provide better EMI performance due to the physical isolation among different ranks.

Another limiting factor of IC die and package performance are electromagnetic interference (EMI) effects. Improving IC component isolation by dividing the IC components onto multiple level-two and/or level-three IC dies reduces EMI effects, which further boosts IC die and package performance (e.g., the clock speed of the IC dies and package may be increased). For EMI effects, the multiple package configurations may provide better EMI performance due to the physical isolation among different ranks. The resulting IC component isolation described herein may reduce cross-talk and EMI effects by more than 50%, which may result in a IC die and package clock speed increase of more than 30%.

Moreover, in cases where the level-two and/or level-three IC dies are memory circuits (e.g., DRAM, DDR3 RAM, etc.), IC routing may be more independent among different memory channels and different memory ranks. This helps alleviate loading due to fan-out of the clock signal, which in turn may increase IC die and package performance.

Response to Warpage

Figure 20:
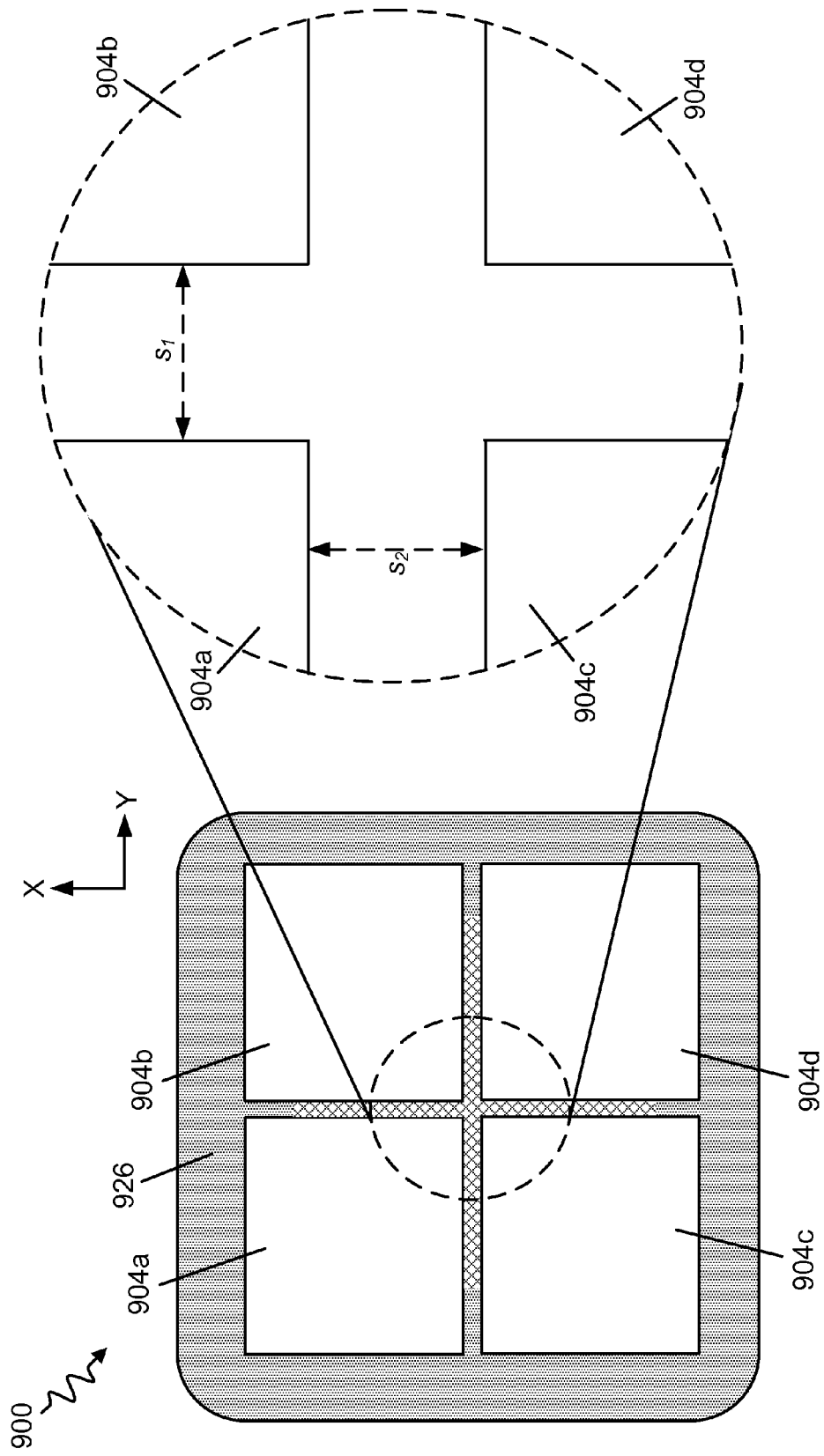
FIGS. 20 and 21 respectively illustrate schematic, top and bottom views of the stacked multi-chip IC package.
Figure 21:
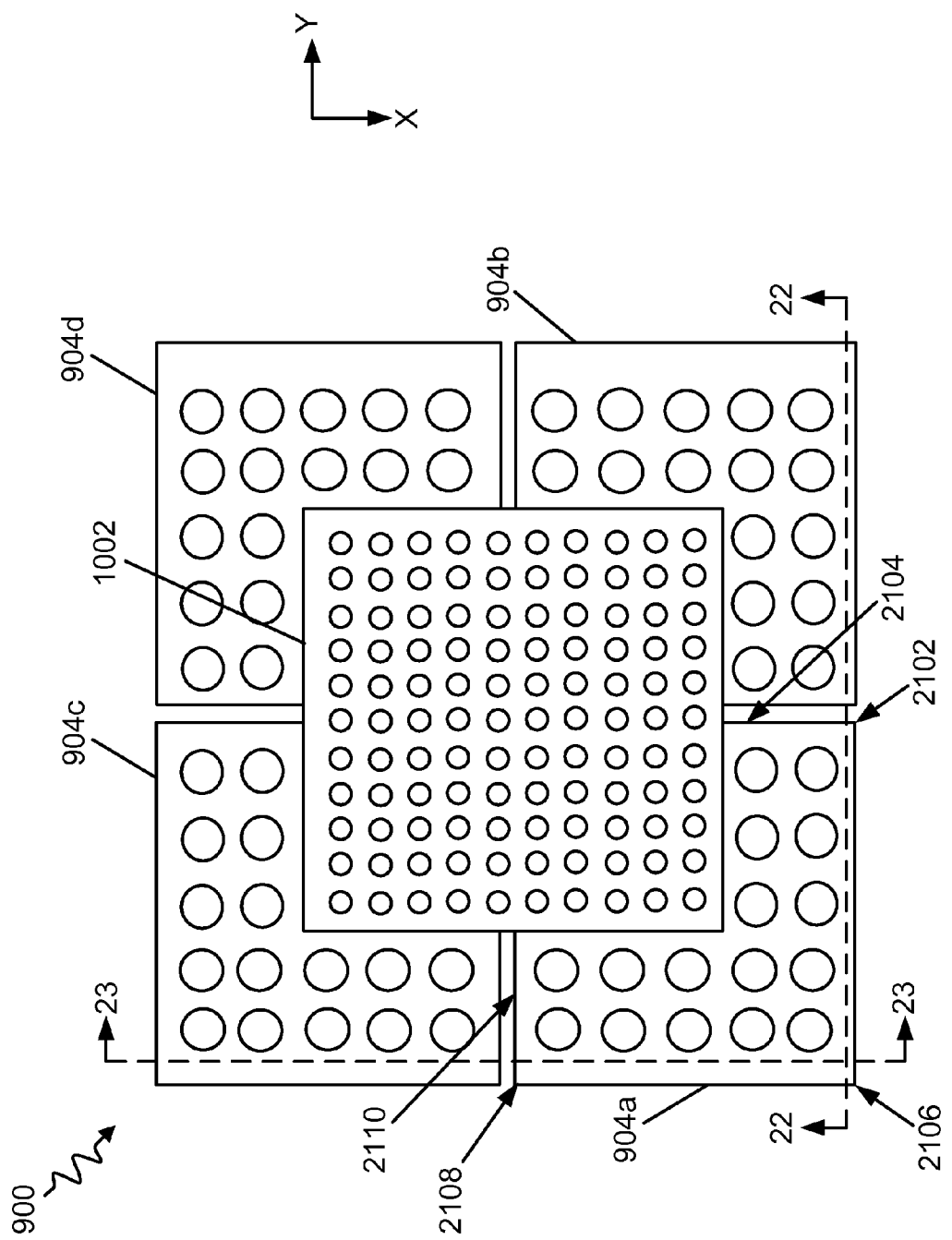

FIGS. 20 and 21 respectively illustrate schematic, top and bottom views of the stacked multi-chip IC package 900. As described above, the package 900 comprises the level-one IC die 1002 and four (4) level-two IC dies 904a, 904b, 904c, 904d. FIG. 20 also shows a close-up portion of the package 900 that illustrates spacings $s_1$ and $s_2$ between the level-two IC dies 904a, 904b, 904c, 904d. Specifically, a spacing $s_1$ exists between: the first level-two IC die 904a and the second level-two IC die 904b; and the third level-two IC die 904c and the fourth level-two IC die 904d. Another spacing $s_2$ exists between: the first level-two IC die 904a and the third level-two IC die 904c; and the second level-two IC die 904b and the fourth level-two IC die 904d.

Referring to FIGS. 9 and 20, in one aspect, the amount of spacing $s_1$ may be between 0.1% and 1% of the width $w_{C1}$ or $w_{C2}$. According to another aspect, the amount of spacing $s_1$ may be between 1% and 5% of the width $w_{C1}$ or $w_{C2}$. In another aspect, the amount of spacing $s_1$ may be between 5% and 10% of the width $w_{C1}$ or $w_{C2}$. In yet another aspect, the amount of spacing $s_1$ may be between 10% and 20% of the width $w_{C1}$ or $w_{C2}$. Similarly, in one aspect, the amount of spacing $s_2$ may be between 0.1% and 1% of the length $lc_1$ or $lc_2$. According to another aspect, the amount of spacing $s_2$ may be between 1% and 5% of the length $lc_1$ or $lc_2$. In another aspect, the amount of spacing $s_2$ may be between 5% and 10% of the length $lc_1$ or $lc_2$. In yet another aspect, the amount of spacing $s_2$ may be between 10% and 20% of the length $lc_1$ or $lc_2$.

Figure 4:
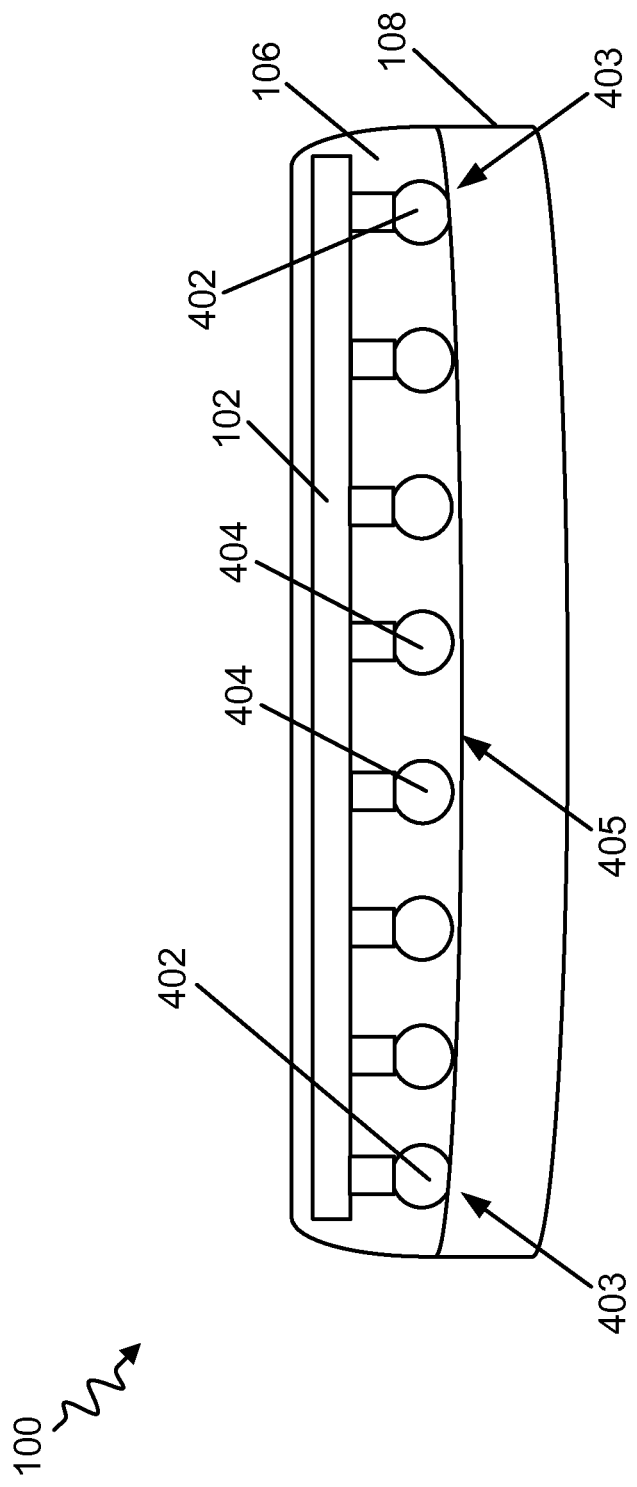
FIG. 4 illustrates a schematic, cross sectional side view of the SIP where the substrate has undergone significant concave warpage.
Figure 22:
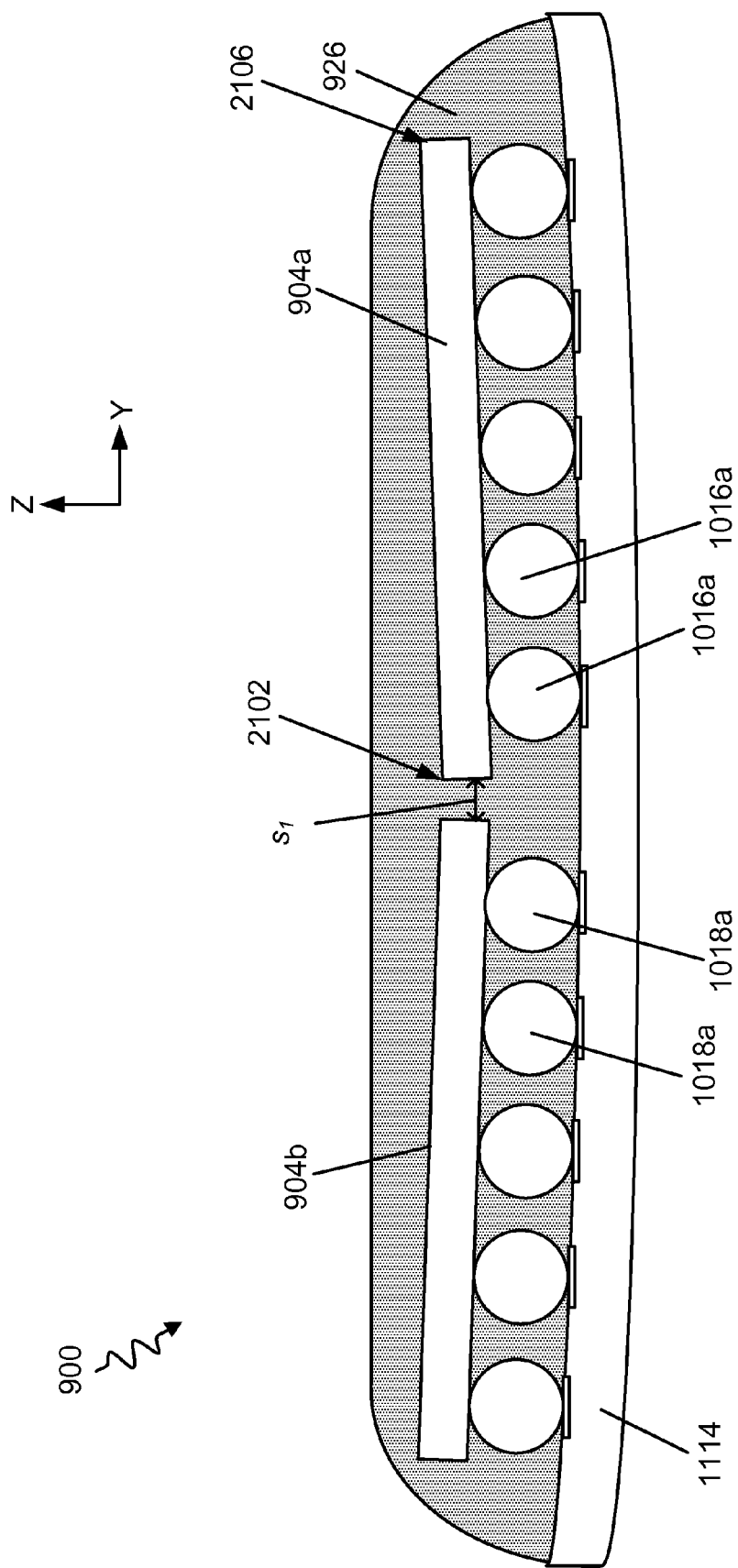
FIGS. 22 and 23 illustrate schematic, cross-sectional side views of the stacked multi-chip IC package after the substrate has undergone warpage according to one aspect.
Figure 23:
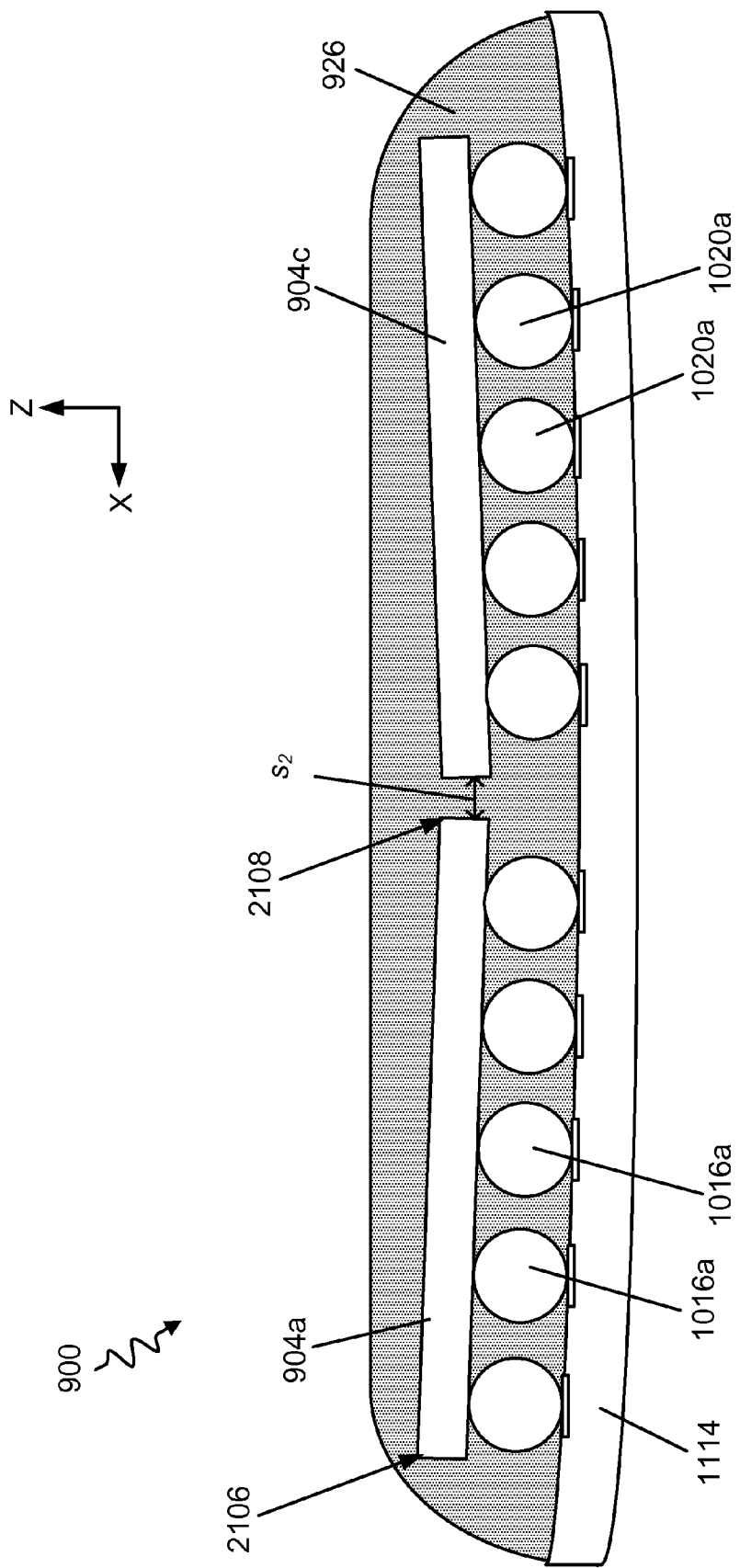

FIGS. 22 and 23 illustrate schematic, cross-sectional side views of the stacked multi-chip IC package 900 after the substrate 1114 has undergone warpage according to one aspect. The IC package 900, featuring a plurality of smaller level-two IC dies 904a, 904b, 904c, 904d, is more resistant to failure due to warpage than prior art designs that feature a single, large upper level IC die 102 (See FIGS. 1 and 4). While one or more soldering bumps 404 of the single IC die 102 may lose electrical contact with their respective substrate 108, the spacings $s_1$ and $s_2$ between the level-two IC dies 904a, 904b, 904c, 904d (shown in FIGS. 22 and 23) allow the dies 904a, 904b, 904c, 904d to bend and/or rotate with respect to one another so that the electrical conductors 1016a, 1018a, 1020a, 1022a do not lose electrical contact with the substrate 1114. Specifically, the spacing $s_1$ allows a first corner 2102 and a first side 2104 of the first level-two IC die 904a to move lower (i.e., dip under, with respect to the Z vertical direction) than a second corner 2106 in response to substrate 1114 warpage. Similarly, the spacing $s_2$ allows a third corner 2108 and a second side 2110 of the first level-two IC die 904a to move lower (i.e., dip under, with respect to the Z vertical direction) than the second corner 2106 in response to the warping of the substrate 1114. The other IC dies 904b, 904c, 904d may also react in the same way to the concave warpage as the first level-two IC die 904a just described.

Although the illustrated examples of FIGS. 22 and 23 show the resistance and response of the level-two IC dies 904a, 904b, 904c, 904d to a concave substrate warpage, the same principles apply to make said dies 904a, 904b, 904c, 904d resistant to convex warpage. For example, in such a case the spacing $s_1$ may allow the first corner 2102 and the first side 2104 of the first level-two IC die 904a to move higher (i.e., go above, with respect to the Z vertical direction) than the second corner 2106 in response to convex substrate 1114 warpage. Similarly, the spacing $s_2$ may allow the third corner 2108 and the second side 2110 of the first level-two IC die 904a to move higher (i.e., go above, with respect to the Z vertical direction) than the second corner 2106 in response to convex substrate 1114 warpage. The other IC dies 904b, 904c, 904d may also react in the same way to the convex warpage as the first level-two IC die 904a just described.

Figure 24:
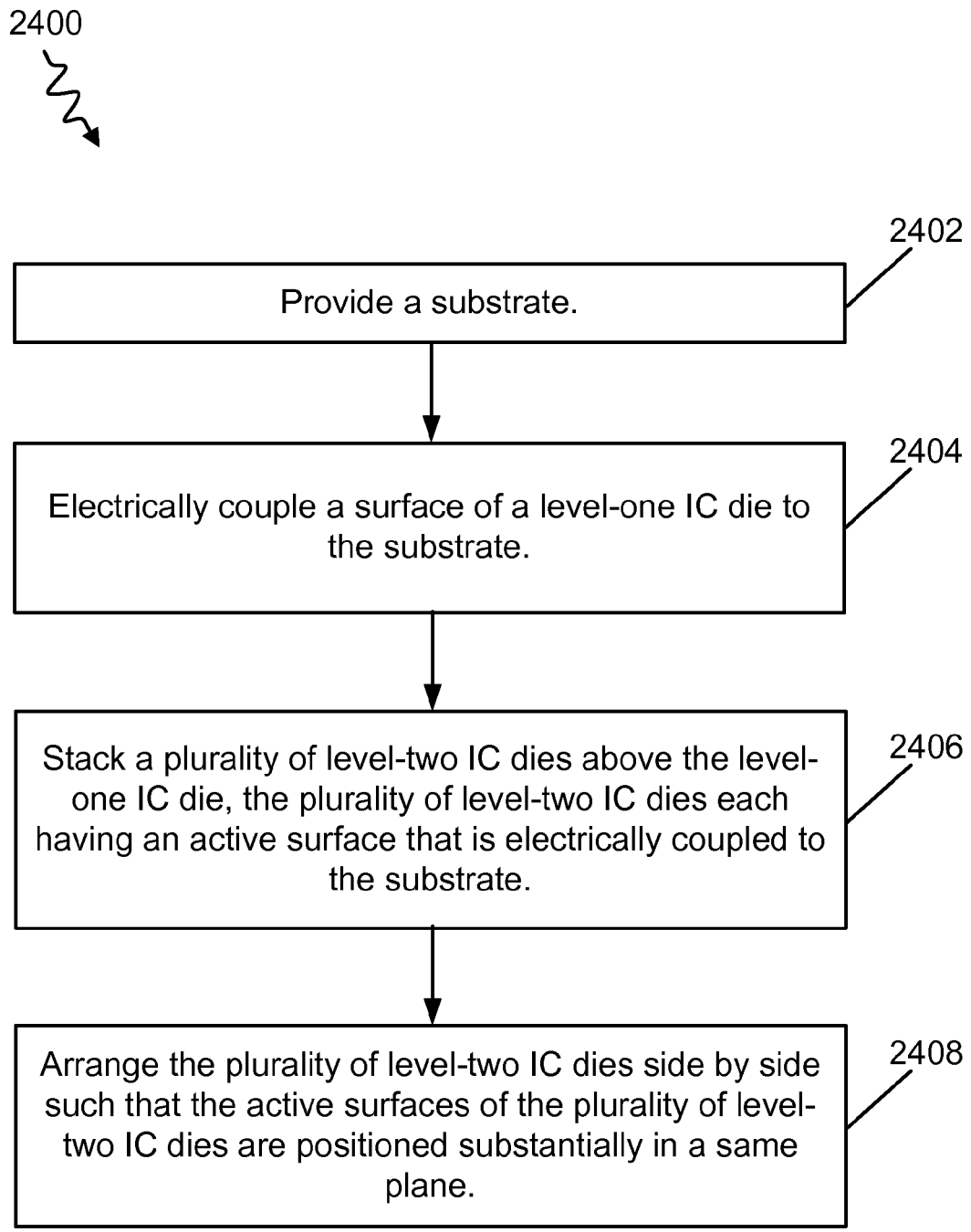
FIG. 24 illustrates a flowchart for a method of manufacturing a multi-chip IC package according to one aspect of the disclosure.

FIG. 24 illustrates a flowchart 2400 for a method of manufacturing a multi-chip IC package according to one aspect of the disclosure. At step 2402, a substrate is provided. At step 2404, a surface of a level-one IC die is electrically coupled to the substrate. In one example, an active surface of the level-one IC die may face the substrate (e.g., as illustrated in FIGS. 13 and 19). In other examples, the active surface of the level-one IC die may face up, opposite the substrate. At step 2406, a plurality of level-two IC dies is stacked above the level-one IC die, where the plurality of level-two IC dies each has an active surface that is electrically coupled to the substrate. At step 2408, the plurality of level-two IC dies are arranged side by side such that the active surfaces of the plurality of level-two IC dies are positioned substantially in a same plane.

Note that description of the method in FIG. 24 assumes that the level-one IC die is in a flip chip arrangement, such that its active surface is coupled to the substrate. However, this method may also be implemented even when the active surface is on the top side (opposite the substrate) using bond wires to electrically couple it the substrate and/or through substrate vias (TSV).

Figure 25:
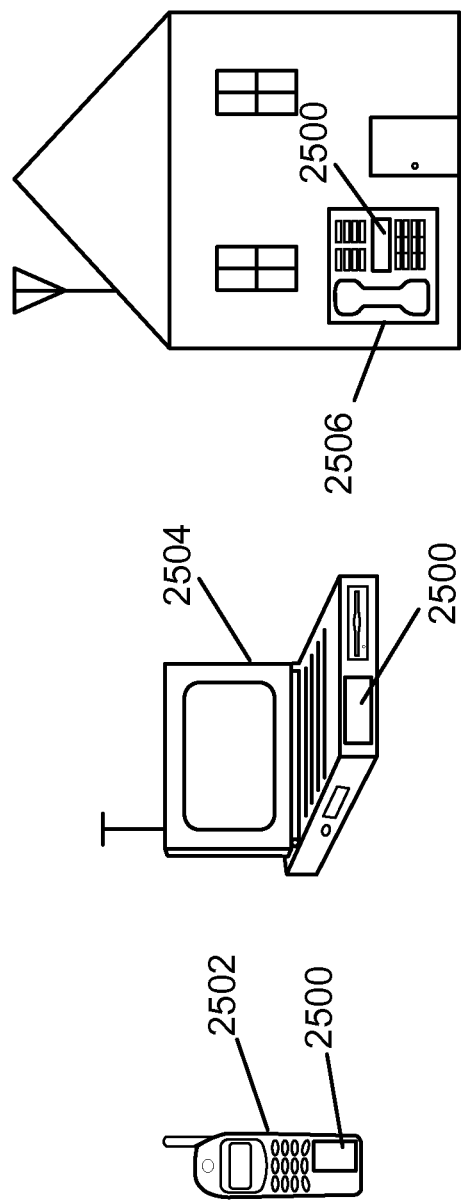
FIG. 25 illustrates various electronic devices that may be integrated with any of the aforementioned IC packages.

FIG. 25 illustrates various electronic devices that may be integrated with any of the aforementioned IC packages 500, 900, 1500, 1700. For example, a mobile telephone 2502, a laptop computer 2504, and a fixed location terminal 2506 may include an IC package 2500 featuring a plurality of level-two and level-three IC dies. The IC package 2500 may be, for example, any of the packages 500, 900, 1500, 1700 described herein. The devices 2502, 2504, 2506 illustrated in FIG. 25 are merely exemplary. Other electronic devices may also feature the IC package 2500 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Moreover, a storage medium may represent one or more devices for storing data, including read-only memory (ROM), random access memory (RAM), magnetic disk storage mediums, optical storage mediums, flash memory devices and/or other machine-readable mediums and, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium", "computer-readable medium", and/or "processor-readable medium" and executed by one or more processors, machines and/or devices.

Furthermore, aspects of the disclosure may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

Those of skill in the art would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A multi-chip integrated circuit (IC) package, comprising:
   a substrate;
   a level-one IC die having a surface that is configured to be electrically coupled to the substrate; and
   a plurality of level-two IC dies stacked at an offset distance above the level-one IC die, the plurality of level-two IC dies each having an active surface that is configured to be electrically coupled to the substrate, the plurality of level-two IC dies arranged side by side such that the active surfaces of the plurality of level-two IC dies are positioned substantially in a same plane.

2. The IC package of claim 1, further comprising:
   a plurality of electrical conductors that electrically couple the plurality of level-two IC dies to the substrate, the plurality of electrical conductors disposed on at least one active surface perimeter overhang region of each of the plurality of level-two IC dies.

3. The IC package of claim 1, further comprising:
   an adhesive layer disposed between the offset distance to secure the plurality of level-two IC dies to the level-one IC die.

4. The IC package of claim 1, wherein the plurality of level-two IC dies comprises two (2) level-two IC dies, and the two (2) level-two IC dies have at least one of a length and/or a width that is different from one another.

5. The IC package of claim 4, wherein each of the two (2) level-two IC dies includes three sides having an active surface perimeter overhang region that includes a plurality of electrical conductors that electrically couple each of the two (2) level-two IC dies to the substrate.

6. The IC package of claim 1, wherein the plurality of level-two IC dies comprises four (4) level-two IC dies, wherein each of the dies has at least one of a length and/or a width that is different from one another.

7. The IC package of claim 1, wherein the plurality of level-two IC dies comprises three (3) level-two IC dies.

8. The IC package of claim 1, wherein the plurality of level-two IC dies are positioned such that a juncture of the plurality level-two IC dies is off-center with respect to the level-one IC die.

9. The IC package of claim 1, further comprising:
   a plurality of level-three IC dies stacked at a second offset distance above the level-two IC dies, the plurality of level-three IC dies each having an active surface that is configured to be electrically coupled to the substrate, the plurality of level-three IC dies arranged side by side such that the active surfaces of the plurality of level-three IC dies are positioned substantially in another same plane, wherein the second offset distance is greater than the first offset distance.

10. The IC package of claim 9, further comprising:
    an adhesive layer disposed between the second offset distance to secure the plurality of level-three IC dies to the level-two IC dies.

11. The IC package of claim 9, wherein a number of the plurality of level-three IC dies is greater than a number of the plurality of level-two IC dies.

12. The IC package of claim 9, wherein each of the plurality of level-two IC dies is larger than the level-one IC die, and each of the plurality of level-three IC dies is larger than the plurality of level-two IC dies.

13. The IC package of claim 1, wherein at least one spacing between two (2) level-two IC dies of the plurality of level-two IC dies allows the two (2) level-two IC dies to bend or rotate with respect to one another and remain electrically coupled to the substrate in response to warpage of the substrate.

14. The IC package of claim 1, wherein at least one spacing between two (2) level-two IC dies of the plurality of level-two IC dies causes a first corner or a first side of a first level-two IC die to move below a second corner of the first level-two IC die in response to concave substrate warpage, and further causes the first corner or the first side of the first level-two IC die to move above the second corner of the first level-two IC die in response to convex substrate warpage.

15. A method for manufacturing a multi-chip integrated circuit (IC) package, the method comprising:
    providing a substrate;
    electrically coupling a surface of a level-one IC die to the substrate;
    stacking a plurality of level-two IC dies at a first offset distance above the level-one IC die, the plurality of level-two IC dies each having an active surface that is configured to be electrically coupled to the substrate; and
    arranging the plurality of level-two IC dies side by side such that the active surfaces of the plurality of level-two IC dies are positioned substantially in a same plane.

16. The method of claim 15, further comprising:
   providing an adhesive layer between the first offset distance to secure the plurality of level-two IC dies to the level-one IC die.

17. The method of claim 15, wherein the plurality of level-two IC dies comprises three (3) level-two IC dies.

18. The method of claim 15, wherein the plurality of level-two IC dies comprises two (2) level-two IC dies, and the two (2) level-two IC dies have at least one of a length and/or a width that is different from one another.

19. The method of claim 15, wherein each of the two (2) level-two IC dies includes three sides having an active surface perimeter overhang region that includes a plurality of electrical conductors that electrically couple each of the two (2) level-two IC dies to the substrate.

20. The method of claim 15, wherein the plurality of level-two IC dies are positioned such that a juncture of the plurality level-two IC dies is off-center with respect to the level-one IC die.

21. The method of claim 17, further comprising:
   stacking a plurality of level-three IC dies at a second offset distance above the level-two IC dies, the plurality of level-three IC dies each having an active surface that is configured to be electrically coupled to the substrate; and
   arranging the plurality of level-three IC dies side by side such that the active surfaces of the plurality of level-three IC dies are positioned substantially in another same plane.

22. The method of claim 21, further comprising:
   providing an adhesive layer between the second offset distance to secure the plurality of level-three IC dies to the level-two IC dies.

23. The method of claim 21, wherein a number of the plurality of level-three IC dies is greater than a number of the plurality of level-two IC dies.

24. The method of claim 21, wherein each of the plurality of level-two IC dies is larger than the level-one IC die, and each of the plurality of level-three IC dies is larger than the plurality of level-two IC dies.

25. A multi-chip integrated circuit (IC) package, comprising:
   a substrate;
   means for electrically coupling a surface of a level-one IC die to the substrate;
   means for stacking a plurality of level-two IC dies at an offset distance above the level-one IC die, the plurality of level-two IC dies each having an active surface that is configured to be electrically coupled to the substrate; and
   means for arranging the plurality of level-two IC dies side by side such that the active surfaces of the plurality of level-two IC dies are positioned substantially in a same plane.

26. The multi-chip integrated circuit package of claim 25, wherein the plurality of level-two IC dies comprises three (3) level-two IC dies.

27. The multi-chip integrated circuit package of claim 25, wherein the plurality of level-two IC dies are positioned such that a juncture of the plurality level-two IC dies is off-center with respect to the level-one IC die.

28. The multi-chip integrated circuit (IC) package of claim 25, further comprising:
   means for stacking a plurality of level-three IC dies at a second offset distance above the level-two IC dies, the plurality of level-three IC dies each having an active surface that is configured to be electrically coupled to the substrate; and
   means for arranging the plurality of level-three IC dies side by side such that the active surfaces of the plurality of level-three IC dies are positioned substantially in another same plane.

29. The multi-chip integrated circuit package of claim 28, wherein a number of the plurality of level-three IC dies is greater than a number of the plurality of level-two IC dies.

30. The multi-chip integrated circuit package of claim 28, wherein each of the plurality of level-two IC dies is larger than the level-one IC die, and each of the plurality of level-three IC dies is larger than the plurality of level-two IC dies.

* * * * *